(12) United States Patent
Kholodenko et al.

(10) Patent No.: US 7,998,304 B2
(45) Date of Patent: Aug. 16, 2011

(54) METHODS OF CONFIGURING A PROXIMITY HEAD THAT PROVIDES UNIFORM FLUID FLOW RELATIVE TO A WAFER

(75) Inventors: Arnold Kholodenko, San Francisco, CA (US); Cheng-Yu (Sean) Lin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 441 days.

(21) Appl. No.: 12/340,394

(22) Filed: Dec. 19, 2008

(65) Prior Publication Data

US 2009/0159201 A1 Jun. 25, 2009

Related U.S. Application Data

(60) Provisional application No. 61/065,088, filed on Feb. 8, 2008, provisional application No. 61/008,856, filed on Dec. 20, 2007.

(51) Int. Cl.
*G03F 7/16* (2006.01)
(52) U.S. Cl. ............ 156/308.2; 156/292; 137/561 A; 29/613

(58) Field of Classification Search ........... 156/292, 156/308.2; 137/561 A; 29/613
See application file for complete search history.

(56) References Cited

U.S. PATENT DOCUMENTS 5,041,181 A * 8/1991 Brackett et al. ............... 156/84
6,954,993 B1 10/2005 Smith et al.
2006/0124153 A1 6/2006 Yun et al.

FOREIGN PATENT DOCUMENTS

JP 2003-266030 9/2003
KR 10-2005-0026766 3/2005

* cited by examiner

*Primary Examiner* — Jeff H Aftergut
*Assistant Examiner* — Jaeyun Lee
(74) *Attorney, Agent, or Firm* — Martine Penilla & Gencarella, LLP

(57) ABSTRACT

Methods configure a proximity head for conditioning fluid flow relative to a proximity head in processing of a surface of a wafer by a meniscus. The methods configure the head in one piece while maintaining head rigidity even as the head is lengthened for cleaning of large diameter wafers. The one-piece head configuring separates main fluid flows from separate flows of fluid relative to the wafer surface, with the separation being by a high resistance fluid flow configuration, resulting in substantially uniform fluid flows across increased lengths of the head in a unit for either fluid supply or return.

20 Claims, 17 Drawing Sheets

METHODS OF CONFIGURING A PROXIMITY HEAD THAT PROVIDES UNIFORM FLUID FLOW RELATIVE TO A WAFER

CLAIM OF PRIORITY

This application claims the priority of U.S. Provisional Application No. 61/065,088, filed on Feb. 8, 2008, and titled "Apparatus for Substantially Uniform Fluid Flow Rates Relative To A Proximity Head in Processing Of A Wafer Surface By A Meniscus", and U.S. Provisional Application No. 61/008,856, filed on Dec. 20, 2007, and titled "Methods Of Configuring A Proximity Head That Provides Uniform Fluid Flow Relative To A Wafer". These applications are incorporated herein by reference in their entireties for all purposes.

CROSS REFERENCE TO RELATED APPLICATIONS

This application is related to U.S. application Ser. No. 10/261,839, filed Sep. 30, 2002, issued on Jun. 26, 2007 as U.S. Pat. No. 7,234,477 and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES"; and U.S. application Ser. No. 10/330,843, filed Dec. 24, 2002, issued as U.S. Pat. No. 7,198,055, on Apr. 3, 2007, and entitled "MENISCUS, VACUUM, IPA VAPOR, DRYING MANIFOLD"; and U.S. application Ser. No. 10/330,897, filed Dec. 24, 2002, issued as U.S. Pat. No. 7,240,679, on Jul. 10, 2007, and entitled "SYSTEM FOR SUBSTRATE PROCESSING WITH MENISCUS, VACUUM, IPA VAPOR, DRYING MANIFOLD"; and U.S. patent application Ser. No. 11/552,794, filed on Oct. 25, 2006, and entitled "APPARATUS AND METHOD FOR SUBSTRATE ELECTROLESS PLATING", which are incorporated herein by reference.

BACKGROUND

1. Field of the Invention

The present invention relates generally to wafer processing processes and to equipment for processing wafers, and more particularly to methods for configuring a proximity head to promote uniform fluid flow relative to the proximity head in processing of a surface of a wafer by a meniscus.

2. Description of the Related Art

In the semiconductor chip fabrication industry, it is necessary to clean and dry a wafer (e.g., a substrate) after a fabrication operation if, e.g., the operation leaves unwanted residues on surfaces of the substrate. Examples of such a fabrication operation include plasma etching and chemical mechanical polishing (CMP), each of which may leave unwanted residues on surfaces of the substrate. Unfortunately, if left on the substrate, the unwanted residues may cause defects in devices made from the substrate, in some cases rendering the devices inoperable.

Cleaning the substrate after a fabrication operation is intended to remove the unwanted residues. After a substrate has been wet cleaned, the substrate must be dried effectively to prevent water or other processing fluid (hereinafter "fluid") remnants from also leaving unwanted residues on the substrate. If the fluid on the substrate surface is allowed to evaporate, as usually happens when droplets form, residues or contaminants previously dissolved in the fluid will remain on the substrate surface after evaporation and can form spots and cause defects.

To prevent evaporation from taking place, the cleaning fluid must be removed as quickly as possible without the formation of droplets on the substrate surface. In an attempt to accomplish this, one of several different drying techniques may be employed such as spin-drying, IPA, or Marangoni drying. All of these drying techniques utilize some form of a moving liquid/gas interface on a substrate surface, which, only if properly maintained, results in drying of a substrate surface without the formation of droplets. Unfortunately, if the moving liquid/gas interface breaks down, as often happens with all of the aforementioned drying methods, droplets form, droplet evaporation occurs, and contaminants remain on the substrate surface.

In view of the foregoing, there is a need for improved ways to configure cleaning apparatus to provide efficient substrate cleaning while reducing the likelihood of contaminants remaining on the substrate surface from dried fluid droplets.

SUMMARY

Broadly speaking, embodiments of the present invention fill the above need for methods of configuring a proximity head to condition fluid flow that is relative to a proximity head in processing of a surface of a wafer by a meniscus. The need is filled by a method of configuring the proximity head in one piece so that fluid may be introduced into the proximity head for delivery to the wafer surface, and so that fluid may be introduced into the proximity head from the surface of the wafer, and head rigidity is maintained even as the head is lengthened to enable cleaning of wafers with larger diameters.

The proximity head may have a head surface with a plurality of flat surfaces. With the plurality of flat surfaces configured for placement in a substantially parallel orientation with respect to the surface of the wafer, fluid flowing in a main flow in the head for delivery to the wafer surface must be substantially conditioned to define a substantially uniform fluid outflow from a plurality of outlet ports to the wafer surface. With the plurality of flat surfaces in that orientation, fluid flowing in separate flow paths from a plurality of outlet ports to another main flow in the head must be substantially conditioned to define a substantially uniform fluid inflow into the inlet ports from the wafer surface.

The need is further filled by the method of configuring the proximity head that maintains head rigidity by a one-piece configuration while defining the main fluid flows and defining the separate flows of fluid relative to the wafer surface, and while the flow configurations in the head enable the separate flows into the inlet ports, and from the outlet ports, to be uniform across the increased length of the head. To provide the conditioned flows from and into the head, the method of configuring the head increases a number of operations of head configuration according to low tolerances, and requires only one operation of head configuration according to a high tolerance, for configuring one fluid supply unit, or one fluid return unit, each of which is configured for fluid conditioning. The configuration according to the high tolerance is limited to configuring one flow resistor of the head to provide a highest flow resistance path between the main fluid flow and the respective plurality of inlet and outlets ports, and is effective to render the respective flows of the fluid uniform across the length of the head even though the other operations are according to the low tolerances.

It should be appreciated that the present invention can be implemented in numerous ways, including as a method and a process. Several inventive embodiments of the present invention are described below.

In one embodiment, a method is provided for configuring a proximity head for transferring fluid relative to the head in a plurality of fluid transfer flow paths, each of which flows at a rate that is substantially uniform relative to flow rates in the other paths. The method may include an operation of configuring a first block with a first mating surface and with a solid interior bounded on one side by the mating surface and bounded by spaced first and second end surfaces extending transversely to the mating surface. A first series of operations is performed in the block according to a low-tolerance. One of the operations of the first series is to configure a main fluid flow path extending through the first end surface into the first block and extending toward the second end surface. A second of the operations of the first series is to configure a second fluid flow path in the first block through either (i) the mating surface and the first end surface, or (ii) the first mating surface.

The defined second fluid flow path has a cross-shaped cross section of a plenum and a resistance bore open to the plenum. A third of the operations of the first series configures a plurality of connector fluid flow paths in the first block connecting the main fluid flow path to the second fluid flow path. The configuring of the connector fluid flow paths is performed by access to the first block through a plane of the mating surface. Another method operation configures a second block with a second mating surface and with a solid interior bounded on one side by the second mating surface and on an opposite side by a fluid transfer surface. A second series of operations is performed in the second block according to the low-tolerance. One of the second operations is to configure a portion of the plenum through the second mating surface into the second block. A second operation of the second series of operations is to configure a plurality of fluid transfer bores in the second block and intersecting the portion of the plenum and intersecting the fluid transfer surface to define the fluid transfer paths.

Another operation fuses the first and second mating surfaces to render the first and second blocks unitary with the plenum open to and between both the plurality of fluid transfer bores and the cross-shaped cross-section of the second fluid flow path. After the first and second series of operations, an operation configures a resistor for reception in the resistance bore. The resistor configuring is according to a high tolerance. The resistor configuring defines a fluid flow path of high fluid flow resistance between the main fluid flow path and the fluid transfer bores. The high resistance is relative to fluid flow resistance of the main fluid flow path and of the plurality of fluid transfer bores and of the connector fluid flow paths. In this manner, the method configures the head so that fluid flowing in each of the plurality of fluid transfer bores will be at a flow rate value that is substantially uniform relative to the flow rate values of fluid flowing in all of the other fluid transfer bores.

In another embodiment, a method is provided for configuring a proximity head for transferring fluid between the head and a wafer. The configuration is so that the transferred fluid is in a plurality of fluid transfer flow paths and so that a flow rate of fluid in each of the flow paths is at a value that is substantially uniform relative to the values of the flow rates in the other fluid transfer flow paths. The fluid is characterized by being compatible with a limited group of materials. The method includes an operation of configuring a first block with a first planar mating surface and with a solid interior bounded on one side by the mating surface and bounded by spaced first and second end surfaces extending transversely of the mating surface. The first block is made from a material within the limited group of materials. A first series of other operations is performed in the block using a first set of tools. The first set of tools has a low tolerance with respect to machining the material.

A first operation of the first series is moving a first tool of the first set through the first end surface to define a main fluid flow path in the first block. The main fluid flow path extends from the first end surface to a location adjacent to the second end surface. The second operation of the first series of operations is further moving one or more other second tools of the first set through either (i) the mating surface and the first end surface, or (ii) the mating surface, to define a second fluid flow path in the first block. The second fluid flow path is configured having a cross-shaped cross section comprising a first plenum and a first portion of a second plenum and a resistance bore having one side open to the first plenum and having a second side open to the first portion of the second plenum. A third operation of the first series of operations is further moving a third tool of the first set through a plane defined by the first mating surface to define a plurality of connector bores in the first block between the main fluid flow path and the first plenum. The plurality of connector bores are spaced from each other in a direction parallel to the first mating surface. Another operation configures a second block with a second planar mating surface and with a solid interior bounded on one side by the second planar mating surface and bounded on an opposite side by a fluid transfer surface. The configured second block is made from the same material from which the first block is made.

A further, or fourth, operation of a second series of operations in the second block uses a second set of tools. The second set of tools has a low tolerance with respect to machining the material. The fourth operation extends a fourth tool of the second set through the second mating surface to define a second portion of the second plenum. A fifth operation of the second series of operations extends a fifth tool of the second set through the second block to define a plurality of fluid transfer bores that intersect the second portion of the second plenum. The plurality of fluid transfer bores is spaced from each other in a direction parallel to the first mating surface. In an further operation, there is fusing of the first and second mating surfaces to join the first and second blocks into one unit having the portions of the second plenum connecting the plurality of fluid transfer bores and the cross-shaped cross-section of the second fluid flow path.

After the first and second series of operations, an operation configures a resistor for reception in the resistance bore, the resistor configuring being according to a high tolerance to define the second fluid flow path as a fluid path of highest fluid flow resistance between the main fluid flow path and the fluid transfer bores. The highest resistance is in relation to fluid flow resistance of the main fluid flow bore and of the connector fluid flow paths and of the second fluid flow path and of the fluid transfer bores. In this manner, fluid flowing in each of the plurality of fluid transfer bores will be at a flow rate having a value that is substantially uniform relative to the value of the flow rates of fluid flowing in all of the other fluid transfer bores.

In yet another embodiment, a method is provided for configuring a proximity head for transferring fluid relative to the head in a plurality of fluid transfer flow paths each of which flows at a rate that is substantially uniform relative to flow rates in the other paths. The fluid transfer flow paths include fluid supply paths from the head to a wafer and fluid return paths from the wafer to the head. The method includes an operation of configuring a first block with a first mating surface and with a solid interior bounded on one side by the first mating surface and bounded by spaced first and second end surfaces extending transversely to the first mating surface and bounded by spaced front and rear surfaces.

Operations are performed in a first series of operations in the block according to a low-tolerance. The first series of operations is performed at a first location in the block between the front and rear surfaces, and includes a first operation to configure a main fluid supply flow path extending through the first end surface into the first block and extending toward the second end surface. The first series also includes a second operation to configure a central section of a second fluid supply flow path in the first block through the first end surface, the central section having a circular-shaped cross section comprising a supply resistance bore. The first series also includes a third operation to configure an upper crossing section of the second fluid supply flow path and a lower crossing section of the second fluid supply flow path in the first block through the first mating surface so that the second fluid supply flow path has a cross-shaped cross section comprising a first supply plenum configured as the upper crossing section and further comprising a second supply plenum configured as the lower crossing section and still further comprising the supply resistance bore open to and between the first supply plenum and the second supply plenum.

The lower supply plenum intersects the first mating surface. The first series in addition includes a fourth operation to configure a plurality of connector fluid supply flow paths in the first block connecting the main fluid supply flow path to the second fluid supply flow path. The configuring of the connector fluid supply flow paths is performed by access to the first block through a plane of the first mating surface. A second series of operations is performed in the first block according to a low-tolerance, the second series being performed at a second location in the first block between the front and rear surfaces and spaced from the first location.

The second series includes a fifth operation to configure a main fluid return flow path extending through the first end surface into the first block and extending toward the second end surface. The second series includes a sixth operation to configure a second fluid return flow path in the first block through the first mating surface, the defined second fluid return flow path having a cross-shaped cross section comprising an upper return plenum and a lower return plenum and a return resistance bore open on one side to the upper return plenum and open on an opposite side to the lower return plenum, the lower return plenum intersecting the first mating surface.

The second series includes a seventh operation to configure a plurality of connector fluid return flow paths in the first block connecting the main fluid return flow path to the second fluid return flow path, the configuring of the connector fluid return flow paths being performed by access to the first block through the plane of the first mating surface. A yet further operation configures a second block with a second mating surface and with a solid interior bounded on one side by the second mating surface and on an opposite side by a fluid transfer surface and bounded by spaced second block front and rear surfaces. There is also a performing of a third series of operations in the second block according to the low-tolerance, the third series being performed at a third location between the front and rear surfaces of the second block, the third location and the first location being alignable upon mating the first and second mating surfaces. The third series includes an eighth operation to configure a portion of the lower supply plenum through the second mating surface into the second block.

The third series includes a ninth operation to configure a plurality of fluid supply transfer bores in the second block and intersecting the portion of the lower supply plenum and intersecting the lower fluid transfer surface to define the fluid supply paths. There is also performing a fourth series of operations in the second block according to the low-tolerance, the fourth series being performed at a fourth location between the front and rear surfaces of the second block, the fourth location and the second location being alignable upon mating the first and second mating surfaces. The fourth series includes a tenth operation to configure a portion of the lower return plenum through the second mating surface into the second block. The fourth series includes a eleventh operation to configure a plurality of fluid return bores in the second block and intersecting the portion of the lower return plenum and intersecting the fluid transfer surface to define the fluid return paths. A still further operation fuses the first and second mating surfaces to render the first and second blocks unitary, the unitary blocks being configured with the lower supply plenum open to and between both the plurality of fluid supply bores and the cross-shaped cross-section of the second fluid supply flow path. The unitary blocks are configured with the lower return plenum open to and between both of the plurality of fluid return bores and the cross-shaped cross-section of the second fluid return flow path. After the first and third series of operations, there is an operation of configuring a supply resistor for reception in the supply resistance bore, the supply resistor being configured according to a high tolerance, the supply resistor configuration defining a fluid supply flow path of high fluid flow resistance between the main fluid supply flow path and the fluid supply bores.

The high resistance is relative to fluid supply flow resistance of the main fluid supply flow path and of the plurality of fluid supply bores and of the connector fluid supply flow paths. As a result, fluid flowing in each of the plurality of fluid supply bores will be at a flow rate value that is substantially uniform relative to the flow rate values of fluid flowing in all of the other fluid supply bores. After the second and fourth series of operations, an operation configures a return resistor for reception in the return resistance bore, the return resistor being configured according to a high tolerance. The return resistor configuration defines a fluid return flow path of high fluid flow resistance between the main fluid return flow path and the fluid return bores. The high resistance is relative to fluid return flow resistance of the main fluid return flow path and of the plurality of fluid return bores and of the connector fluid return flow paths. As a result, fluid flowing in each of the plurality of fluid return bores will be at a flow rate value that is substantially uniform relative to the flow rate values of fluid flowing in all of the other fluid return bores.

Other aspects and advantages of the invention will become apparent from the following detailed description, taken in conjunction with the accompanying drawings, illustrating by way of example the principles of the invention.

BRIEF DESCRIPTION

The present invention will be readily understood by the following detailed description in conjunction with the accompanying drawings, and like reference numerals designate like structural elements.

DETAILED DESCRIPTION

Figure 1A:
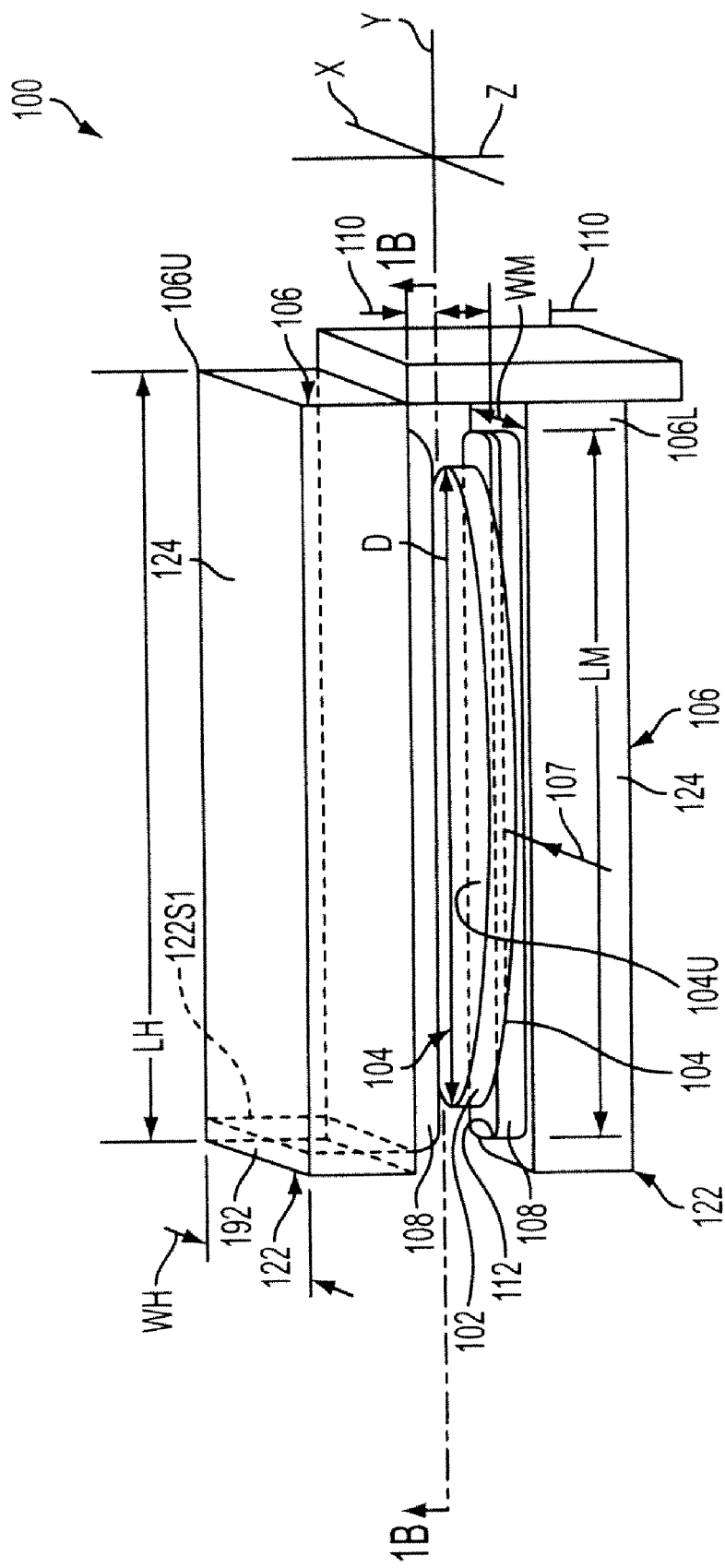
FIG. 1A is a perspective view of proximity heads that are configured by embodiments of the methods of the present invention.

Several exemplary embodiments are disclosed, which define examples of methods for configuring a proximity head to condition fluid flow that is relative to a proximity head in processing of a surface of a wafer by a meniscus. One example is a method of configuring the proximity head in one piece so that fluid may be introduced into the proximity head for delivery to the wafer surface. Another example is a method of such configuring so that fluid may be introduced into the proximity head from the surface of the wafer. In all examples, head rigidity is maintained even as the head is lengthened to enable cleaning of wafers with large diameters.

Exemplary methods configure the proximity head to maintain head rigidity by configuring the head in one-piece head while defining the main fluid flows and defining the separate flows of fluid relative to the wafer surface, so that the flow configurations in the head enable the separate flows into the inlet ports, and from the outlet ports, to be substantially uniform across the increased length of the head. In one example, to provide the conditioned flows from and into the head, a method of configuring the head increases a number of operations of head configuration that are performed according to low tolerances, and requires reduced numbers of operations of head configuration according to high tolerances. Thus, low tolerances are used for configuring a main fluid flow path and connector fluid flow paths. Also, the methods of selective configuring according to high tolerances facilitate configuring the one flow resistance bore and resistor to provide a high resistance fluid flow path between the low tolerance main fluid flow path and fluid flow transfer ports. The methods further enable the configuration to provide for the respective flows of the fluid to be substantially uniform across the length of the head in one flow unit even though the many other operations are according to the low tolerances.

Several inventive embodiments of the present invention (herein referred to as "embodiments") are described below. It will be apparent to those skilled in the art that the present invention may be practiced without some or all of the specific details set forth herein.

The word "wafer," as used herein, denotes without limitation, semiconductor substrates, hard drive disks, optical discs, glass substrates, flat panel display surfaces, liquid crystal display surfaces, etc., on which materials or layers of various materials may be formed or defined in a processing chamber, such as a chamber in which a plasma is established for processing, e.g., etching or deposition. All such wafers may be processed by the embodiments in which improved cleaning systems and methods provide efficient wafer cleaning while reducing the likelihood of contaminants remaining on the wafer surface from dried liquid droplets.

Orientation of the wafer (and of structures) is described herein in terms of orthogonal X, Y and Z axes. Such axes may define directions, such as directions of surfaces or of movements or of planes, etc.

The word "fluid", as used herein, refers to liquids and gases.

The word "meniscus," as used herein, refers to a volume of liquid bounded and contained in part by surface tension of the liquid. In the embodiments, the meniscus in a contained shape can be moved relative to a surface. The "surface" may be a surface of a wafer ("wafer surface"), or a surface of a carrier ("carrier surface") that mounts the wafer, for example. The term "W/C surface" refers collectively to the wafer surface and the carrier surface. A desired meniscus for meniscus processing is stable. The stable meniscus has a continuous configuration. This configuration is continuous completely across a desired width in the X direction and across a desired length (see LM, FIG. 1A) in the Y direction and the meniscus extends continuously across a desired gap in the Z direction. The meniscus may be established to be stable in this continuous configuration by the delivery (or supply) of liquids to the W/C surface while also removing the liquids from the W/C surface. The removal may be by applying reduced pressure to the meniscus, and is referred to as "return".

The term "proximity head", as used herein, refers to an apparatus that can receive liquids, apply the liquids to the W/C surface, and remove the liquids from the W/C surface, when the proximity head is placed in close relation to the W/C surface. The close relation is when there is a small (e.g., 0.5 mm) gap between (i) a carrier surface (or the wafer surface) and (ii) a surface ("head surface") of the proximity head that applies the meniscus to the W/C surface. Thus, the head is spaced by the gap from the W/C surface. In one embodiment, the head surface is placed substantially parallel to the wafer surface and substantially parallel to the carrier surface. In one embodiment the proximity head is configured to supply a plurality of liquids to the gap and is also configured with vacuum ports for removing the supplied liquids.

The term "placed in close relation to" refers to "proximity" of the head surface and the W/C surface, the proximity being defined by the gap. The gap is a proximity distance measured in the Z direction. Different degrees of proximity are possible by adjusting the relative Z direction positioning of the carrier and the head surface. In one embodiment, exemplary proximity distances (gaps) may be between about 0.25 mm and about 4 mm, and in another embodiment may be between about 0.5 mm and about 1.5 mm, and in a most preferred embodiment the gap may be about 0.5 mm.

By controlling the delivery to, and removal of the liquids from, the meniscus, the meniscus can be controlled and moved relative to the W/C surfaces. During the processing the wafer may be moved, while the proximity head is still. The head may also be moved while the wafer remains still.

The term "recipe" refers to computer data, or information in other form, that defines, or specifies, (1) process parameters for a desired meniscus process to be applied to the wafer; and (2) physical parameters related to establishing the gap. For the liquid or liquids that define the meniscus, the process parameters can include the type of liquid, and the pressures, flow rates and chemical properties of the liquid. For the meniscus, the process parameters can include the size, shape and location of the liquid meniscus.

The word "chemistry", as used herein, refers to a particular combination of the fluids specified by the recipe for meniscus processing of a given type of wafer; and involves physical and chemical properties of such fluids and of the materials from which the meniscus processing apparatus is fabricated. Generally, for a particular type of wafer, a specific chemistry is specified by the recipe for the meniscus processing. In turn, the configuration of the meniscus processing apparatus must be compatible with that specific chemistry.

The word "configuring", as used herein, relates to machining operations such as forming, molding, casting, boring, shaping, and grinding of bodies of apparatus, such as a proximity head. Such configuring includes such operations performed on one or more exterior surfaces of the body, such as to define faces or boundaries. Such configuring also includes such operations performed within such bodies, including defining internal holes, bores, fluid flow paths, cavities, and recesses, such as those extending from one of the exterior surfaces into the body. Such operations may cause material removal from the body of a workpiece, so as to define the shape or extent of the exterior surface or one or more surfaces internal to the body.

The word "tolerance", as used herein, may be understood as relating to each of the operations of "configuring" and to each of the operations of "using" one or more "tools", as described below. In one example, a "nominal dimension" is an ideal, exact dimension to be achieved by the configuring. When a specification for the configuring operation requires only the nominal dimension to be achieved, the configuring is said to be "according to" a "zero tolerance". In another example, an operation of configuring may be specified to require achievement of either (i) the "nominal dimension", or (ii) a dimension somewhat different from the exact nominal dimension. The difference between the nominal (or exact) dimension and the permitted different dimension, is referred to as a "tolerance".

When the tolerance is limited to small amounts of difference, e.g., 0.001 of an inch or less, the tolerance is said to be "high"; is generally difficult, or expensive, to achieve; and the configuring is said to be "according to a high tolerance". When the tolerance is less limited, and the specification permits larger amounts of difference, e.g., 0.005 to 0.01 of an inch or more, the tolerance is said to be "low"; is generally easier, or less expensive, to achieve; and the configuring is said to be "according to a low tolerance". When many high tolerances are specified, the configuration is said to be "according to high tolerances". When many low tolerances are specified, the configuration is said to be "according to low tolerances". In other examples, the dimension to be configured may be a diameter of a hole or bore, or a length of a piece, or a direction. The same criteria apply to a nominal one of such dimensions, and to the low and high tolerances relating to such dimensions.

Method Considerations

Analysis by the Applicants of the present invention indicates that one problem in the use of a recipe-controlled meniscus defined between the proximity head and the W/C surface to be processed may be overcome by the embodiments. The problem is the trend in semiconductor chip manufacturing to use wafers having greater and greater diameters. For example, the diameters have ranged from the early 25.4 mm diameter through much iteration to the later 200 mm diameter that in 2007 is being displaced by 300 mm diameter wafers, and in 2007 predictions are for use of a 450 mm diameter, e.g., by 2013. When the proximity head spans a Y direction distance more than the wafer diameter, and when the wafer diameter becomes larger and larger, the meniscus length LD must become longer and longer in the Y direction so as to process the entire wafer in one relative motion between the proximity head and the wafer. The analysis also indicates that the problem relates to a desire to increase throughput of wafers processed by such a meniscus, e.g., to increase the speed of movement of the wafer relative to the proximity head during meniscus processing.

With increases in both meniscus length and the relative speed, such Applicants have identified the uniformity of flow of fluids that define such a meniscus as being related to obtaining desired results of the meniscus processing. The analysis by such Applicants indicates needs for ways to configure a system for conditioning fluid flow, e.g., for conditioning flow introduced into a proximity head for delivery to a surface of a wafer and flow of fluid to be returned from the wafer surface into the proximity head, wherein the configuration must be readily and efficiently configurable yet allow the conditioning of fluid flowing for both delivery to the wafer surface and return, in each case defining a substantially uniform fluid transfer relative to a plurality of outlet ports. This analysis by such Applicants indicates that the need for configuration may be filled by a method that configures the proximity head in one piece, yet configures flow paths that both uniformly introduce fluid into the proximity head (i) for delivery to the wafer surface, and (ii) from the surface of the wafer, and still maintain head rigidity even if the head is lengthened for cleaning of wafers with larger and larger diameters.

To provide the conditioned flows from and into the head, this analysis by these Applicants indicates that the method of configuring the head should increase the number of operations of head configuration that are performed according to low tolerances, and should limit the number of operations of head configuration that are performed according to high tolerances. Also, the operations according to high tolerances should be limited to configuring for fluid conditioning. The configuring according to the high tolerances is limited to configuring one high resistance flow path and paths to a fluid transfer surface of the proximity head. This configuring is effective to render the respective flows of the fluid substantially uniform across the length of the head that is opposite to the wafer, even though the other operations are according to the low tolerances.

Method Operations

With the above method considerations in mind, reference is now made to exemplary method operations for filling the above and other needs, which will enable configuring proximity heads to obtain desired results of the meniscus processing notwithstanding (i) increases in both meniscus length and head-to-wafer relative speed, and (ii) limitations imposed by the chemistry that may be specified by the recipe for a particular meniscus processing. These method operations efficiently define the heads to obtain the desired results of providing uniformity of the flow of fluids that define the meniscus, and efficiently apply to configurations for both fluid introduced into the proximity head for delivery to the wafer surface, and fluid introduced into the proximity head from the wafer surface. In each case the uniformity must be across the length of the proximity head that is opposite to the wafer.

As a preface to describing the embodiments, reference is made to FIG. 1A that shows apparatus 100 for meniscus processing of a wafer 102, in which the apparatus 100 and the wafer 102 are moved relative to each other. Each of two opposite sides, or surfaces, 104 of the wafer may be processed by a separate proximity head 106. Exemplary relative movement is shown in which the proximity heads are stationary and the wafer 102 is moved past the proximity heads 106. The heads 106 are shown straddling the wafer 102 such that the wafer sides 104 are processed at the same time. The above-described problems arising from increases in the wafer diameter D may be understood in that the heads 106 are illustrated as extending completely across and past the wafer diameter D. Thus, as the wafer diameter D increases, the length LH of the heads 106 must be increased. For reference, the head length LH is shown in a Y axis direction. An upper head 106U is shown above a lower head 106L and is shown spaced in a Z axis direction from the lower head 106L. The exemplary movement (arrow 107) of the wafer 102 past the heads 106 is shown as movement in an X axis direction.

Each head 106 is configured to establish a meniscus 108 that spans a gap 110 between the respective head to the respective surface 104. The increases in the length LH increase the structural rigidity required for the head 106 to span the length LH without sagging, for example. Sufficient structural rigidity is required to maintain the gap 110 uniform across that length LH. The meniscus 108 extends in the three X, Y and Z directions. Thus, FIG. 1A shows the meniscus 108 extending from the upper head 106U in the Z direction to an upper wafer surface 104U. The meniscus is also shown having a length LM extending completely across and past the wafer 102 in the Y direction. A width WH of the upper head 106U and a width WM of the meniscus 108 are shown, with both widths extending in the X direction.

Figure 1B:
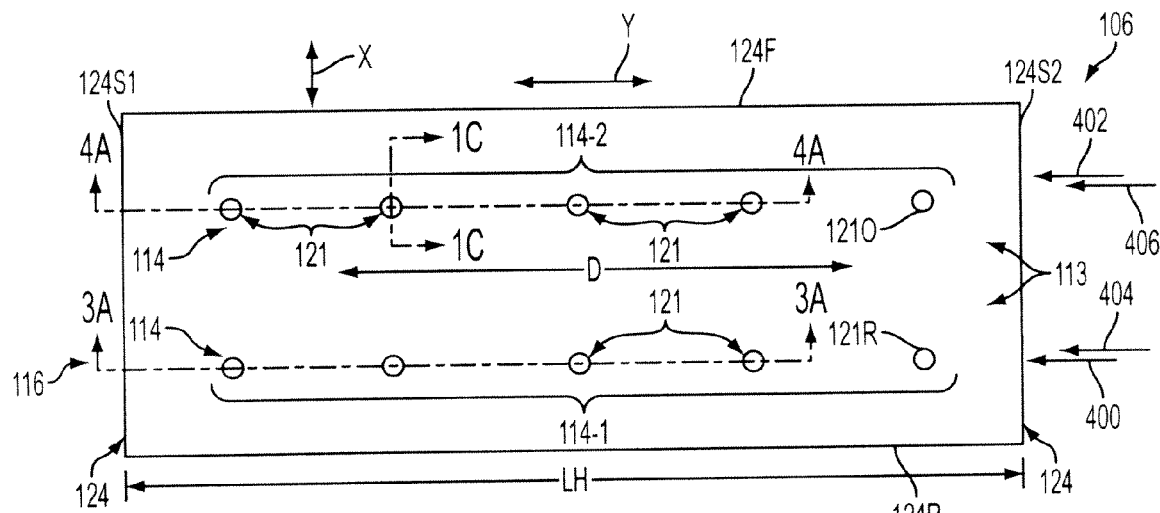
FIG. 1B is a view looking up in FIG. 1A at one proximity head, showing ports of the one proximity heads, the ports being in separate rows of separate fluid flow conditioning units.

FIG. 1B is a view looking upwardly, from just above the meniscus 108 and onto one embodiment of the upper head 106U, illustrating an exemplary arrangement, or network, 113. The network 113 is shown in simplified form illustrating two exemplary fluid conditioning units, or channel, 114. In the network 113 each exemplary fluid conditioning unit 114 extends in a row 116 in the Y direction of the length LH of the head 106. For reference, the diameter D of the wafer 102 is also indicated. Exemplary embodiments of the units 114 are identified as units 114-1 & 114-2. The unit 114-1 is shown extending in a row 116 partly across the length LH of the head 106, extends beyond the diameter D of the wafer 102, and is a supply unit as described below. Unit 114-2 is a return unit as described below. To enable the head 106 to establish the meniscus 108 that spans the gap 110 between the respective head 106 and the respective surface 104, the units 114-1 & 114-2 are shown configured with ports, or fluid transfer ports, 121 each in an exemplary circular configuration through which fluid is transferred to establish the meniscus 108.

Fluid is either supplied to the head 106 and through and out of the ports, referred to as outlet ports 121O, or the fluid is drawn through and into the ports 121, referred to as return ports 121R, and is drawn into the head 106. Still generally, to promote a stable meniscus the units 114 are configured so that fluid flowing for delivery to the wafer surface 104, and fluid flowing for collection from the wafer surface, is "substantially conditioned". In detail, the configuration of the units 114 is such that the fluid is "substantially conditioned" for each type of fluid flow of the units 114, i.e., supply and return. Fluid that is substantially conditioned in the unit 114 of the head 106 is characterised by uniform fluid flow in two respects: (i) uniform outflow from the plurality of outlet ports 121O, e.g., of a row 116 of the supply unit 114-1 to the wafer surface 104, and (ii) uniform inflow from the wafer surface 104 into the plurality of return ports 121R, e.g., of a row 116 of the return unit 114-2.

Whether the flow rate of the fluid through each of the ports 121 of the one unit 114-1 or 114-2 is "uniform" is determined as described below. "Uniformity" of the flow rate through the ports 121 of one unit 114 is defined by three factors. Supply unit 114-1 is used as an exemplary unit in describing Uniformity. One factor, average flow rate ("AFR") is composed of the total flow rate ("TFR") through all ports 121 of the exemplary unit 114-1 (e.g., in ounces per minute), and the TFR is divided by the number of ports 121 in the exemplary unit 114-1. A second factor is the value of the maximum flow rate through any of the ports 121 in the exemplary unit 114, and is identified as "MAX". The third factor is the value of the minimum flow rate through any of the ports 121 in the exemplary unit 114-1, and is identified as "MIN". Uniformity ("U") is based on these three factors as follows:

$$U = [MAX - MIN / AFR] \times 100 \quad \text{[Equation 1]}$$

In a general sense applicable to supply of gas and liquid by a unit 114-1, and to return via a vacuum by a unit 114-2, a "uniform" flow rate through each port 121 of the exemplary unit 114 is indicated by a zero value of Equation 1. Fluid having this zero value of Equation 1 has been "conditioned", i.e., has been ideally conditioned in the unit 114-1. Also in a general sense applicable to supply of gas and liquid by an exemplary unit 114-1, and to return via a vacuum by an exemplary return unit 114-2, fluid having a value of Equation 1 other than zero, and as described below, is said to have been "substantially conditioned". The value of Equation 1 in the ranges described below indicates that the flow rate of such fluid flowing through each such bore 121 of the unit 114-1 is substantially uniform relative to the flow rates of fluid flowing in all of the other ports 121 of the exemplary unit 114-1.

More specifically, the range of values of Equation 1 corresponding to flow rates that are "substantially uniform" through each port 121 of the exemplary unit 114, is determined with respect to the fluid that is being transferred by that unit. For example, in one embodiment of a return unit 114 in which a vacuum applied to the head 106 induces the return, the value of Equation 1 (i.e., Uniformity) was determined to be about 6%, which compares to about 14% in a return head 106P described below. For such return unit 114 of an embodiment, flow rates that are substantially uniform may be in a range from about 9% to about 4%, for example. As another example, in one embodiment of a supply unit 114 of an embodiment in which N2/IPA was supplied to the head 106, the value of Equation 1 (i.e., Uniformity) was determined to be about 3%, which compares to about 5% in a supply head 106P used for the same N2/IPA and described below. For such supply unit 114 of an embodiment, flow rates that are substantially uniform may be in a range from about 2% to about 4%, for example. As another example, in one embodiment of a supply unit 114 in which water was supplied to the head 106, the value of Equation 1 (i.e., Uniformity) was determined to be about 0.7%, which compares to about 3% in a supply head 106P used for water as described below. For such supply unit 114 of an embodiment, flow rates that are substantially uniform may be in a range from about 0.5% to about 2%, for example. The heads 106P noted above were not configured as embodiments, and had the following characteristics (a) many levels of branches in which a main plenum branched into a few flow paths, and each of the few flow paths branched into a small number of flow paths, and those flow paths again branched in a similar manner; (b) the flow paths were each configured according to a high tolerance; (c) four or more separate pieces of the head were required to enable configuration of the many series of branches of the flow paths; and (d) the separate pieces were held together by fasteners.

Other aspects of the configuration of the units (or channels) 114 may be initially understood from FIGS. 1A-1D. These Figures show each of the heads 106 configured as a one-piece block, or polyhedron, 122. The block 122 may be one solid, three-dimensional piece having, or bounded by, many faces 124. Generally, FIG. 1A shows each one-piece block 122 extending (i) in the Y direction of the head length LH; and (ii) in the Z, or fluid flow, or delivery or return, direction perpendicular to the head length direction Y; and (iii) in a width direction WH (the direction X) perpendicular to the Y and Z directions. Each exemplary block 122 may thus be configured as a rectangular parallelepiped. Other exemplary blocks 122 may be configured with faces 124 arranged as may be required for the functions performed by the various units 114. In one embodiment, the block 122 is defined by the faces 124 that are a plurality of mutually perpendicular exterior faces.

Figure 1C:
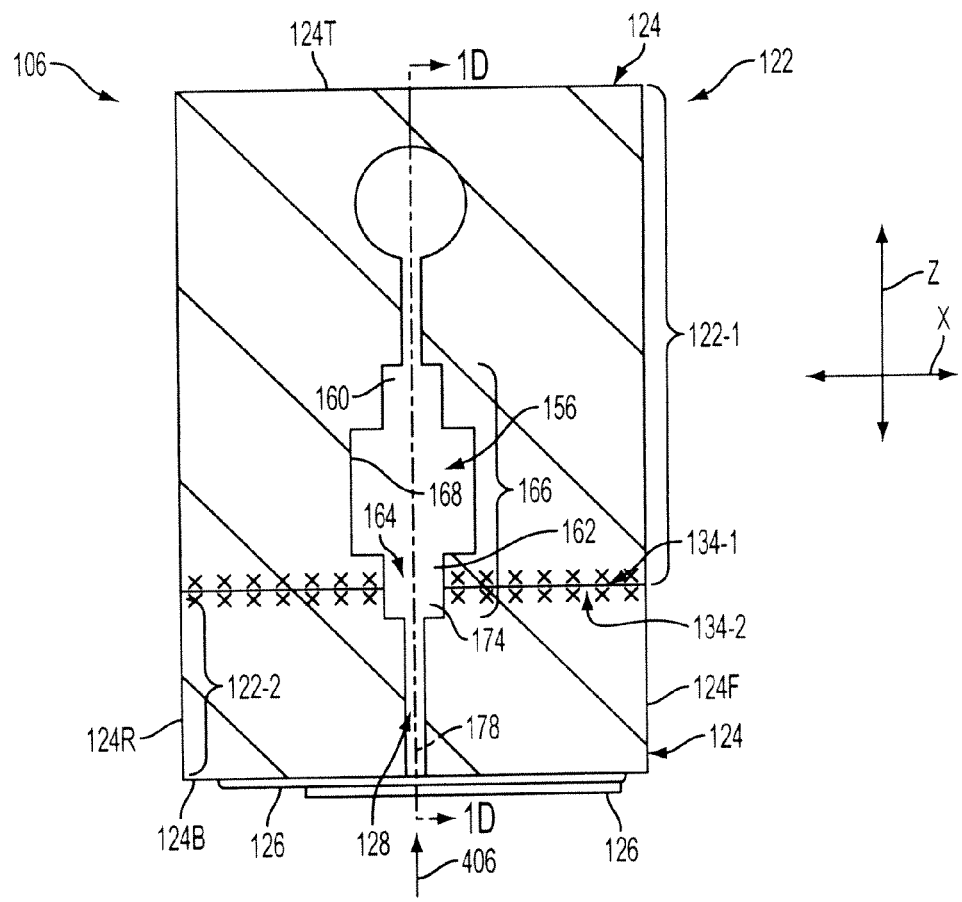
FIG. 1C is a cross-sectional view taken on line 1C-1C in FIG. 1B, illustrating a cross-section of a return fluid flow conditioning unit that may be configured by embodiments of the methods of the present invention.

Referring to the cross section view of FIG. 1C, the upper head 106 is shown with one exemplary bottom face, or fluid transfer surface, 124B. In use such face 124B is oriented opposite to the wafer surface 104 for wafer processing. Face 124B may be composed of many flat surfaces 126. One top face 124T is opposite to the bottom face 124B. In FIG. 1B, opposite side faces 124S1 and 124S2 define the head length LH. One front face 124F is first passed by the wafer 102 as the wafer approaches the head 106 for processing (in FIG. 1A see arrow 107 indicating direction X). One rear face 124R is passed by the wafer as the wafer leaves the head 106 after processing.

In a preferred embodiment, the block 122 of each head 106 is fabricated from a material having high strength properties capable of spanning the wafer 102 as required to enable the flat surfaces 126 to remain spaced from the wafer surface 104 within a moderate range of gap values. A more preferred embodiment is provided when the material from which the block 122 is configured is required to: (i) have the highest strength properties capable of spanning the wafer 102 as required to enable the flat surfaces 126 to remain properly spaced from the wafer surface 104; (ii) be compatible with meniscus processing chemistry in which exemplary fluids include N2 and IPA and water; and (iii) provide a narrowest range of uniformity of the fluid flow rates. This more preferred embodiment is configured with the block 122 of each head 106 fabricated to be one piece of the material described below. In this more preferred embodiment, the exemplary materials may be taken from the group consisting of poly vinylidine di-fluoride (PVDF), and ethylene-chlorotrifluoroethylene (ECTFE) such as that sold under the trademark Halar.

Embodiments of methods for configuring the proximity head 106 for transferring the fluid relative to the proximity head 106 are described. FIG. 1C shows that in one embodiment the fluid may be transferred in a plurality of fluid transfer flow paths 128 that are open to the ports 121. As described above, the flow rate in each such path 128 (e.g., each path 128 that is across the diameter D of the wafer 102), is at a flow rate that is "substantially uniform" (as defined above) relative to flow rates in the other paths 128. That is, the flow rate in each path 128 that is opposite to the diameter D of the wafer 102, is at a flow rate that is substantially uniform relative to the flow rates in the other paths 128 that are also opposite to the diameter D of the wafer 102.

Figure 1D:
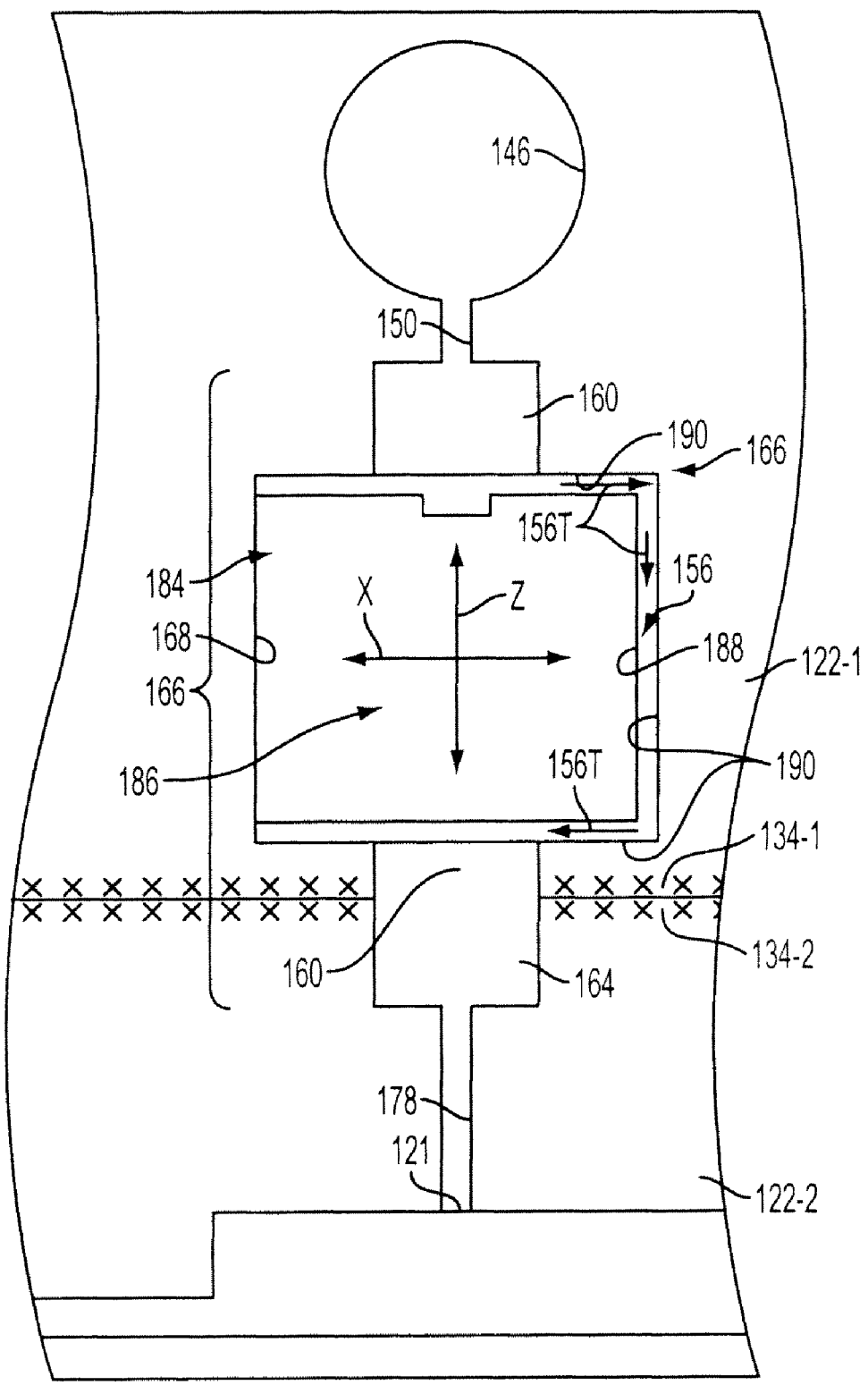
FIG. 1D is an enlargement of a view similar to FIG. 1C, illustrating a resistor configured for insertion into, and received in, the fluid flow conditioning unit.
Figure 2:
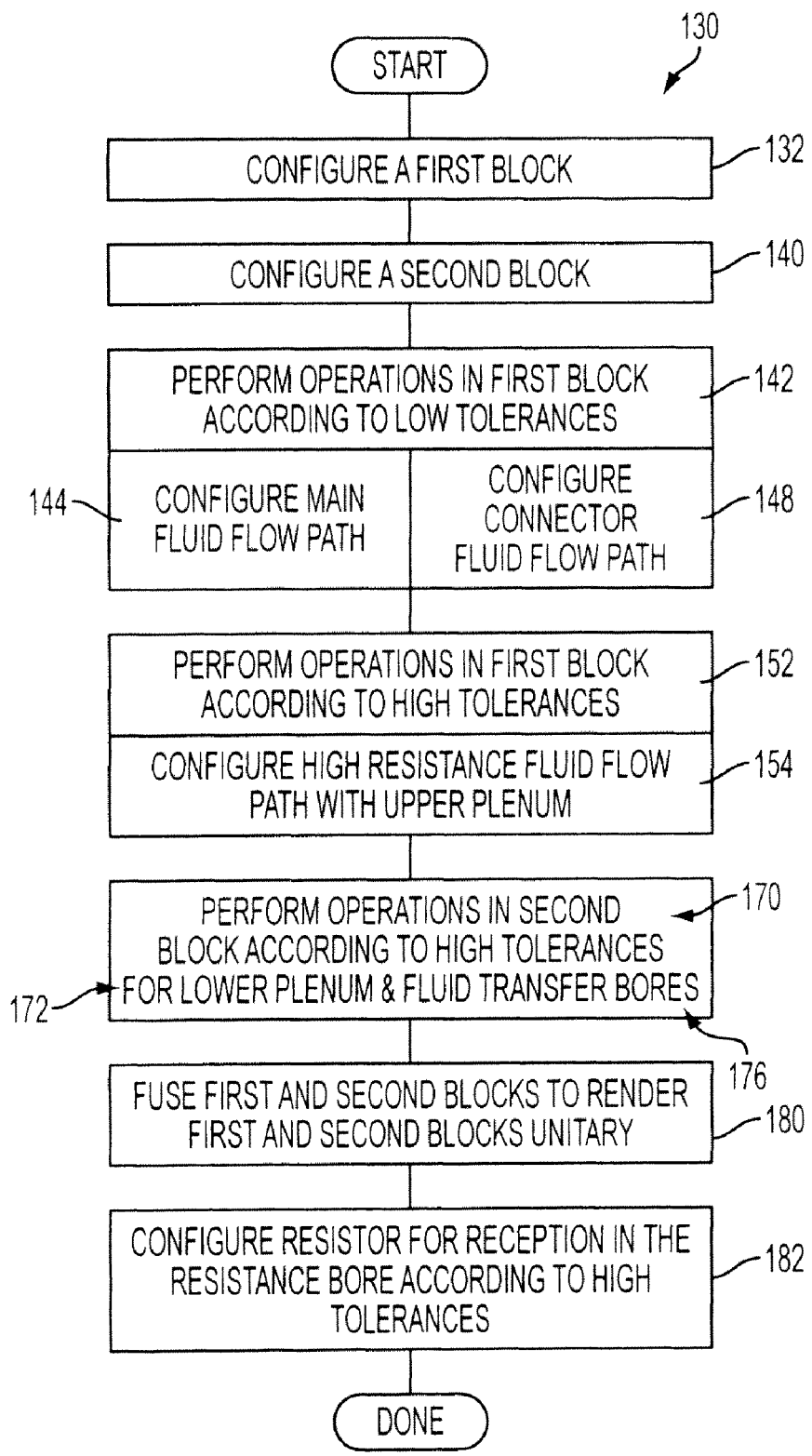
FIG. 2 is a diagram of a flow chart illustrating operations of a method of an embodiment of the present invention.
Figure 3A:
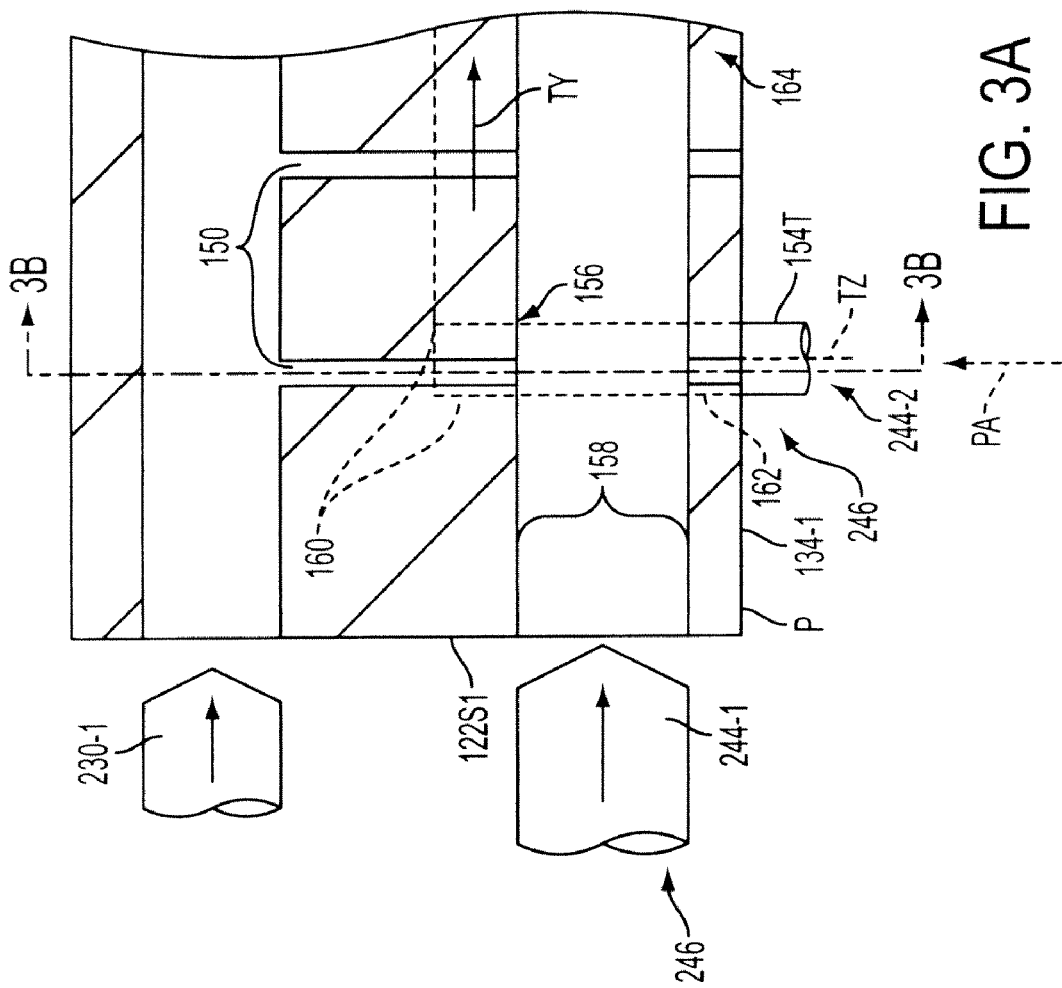
FIGS. 3A-3C are schematic diagrams of operations of configuring a fluid supply unit of a proximity head according to an embodiment of the present invention.

FIG. 2 illustrates a flow chart 130 illustrating operations of the method of one embodiment for configuring the proximity head 106 for transferring the fluid relative to the proximity head 106 that is shown in FIGS. 1A-1D. The method may move from start to an operation 132 of configuring a first block with a first mating surface and with a solid interior bounded on one side by the first mating surface and bounded by spaced first and second end surfaces extending transversely to the first mating surface. FIG. 3A illustrates a block 122-1 as the first block, with the first mating face, or surface, 134-1. Block 122-1 initially has a solid interior, e.g., interior 136-1, that is shown in FIG. 3A after configuration by operations of the method. Interior 136-1 is bounded on one side by the first mating surface 134-1 and is bounded by the spaced first and second faces, or end surfaces, 124S1 and 124S2 that extend transversely to the first mating surface 134. Extending transversely is shown by the X direction of surfaces 124S1 and 124S2 relative to first mating surface 134-1 that is shown extending in the Y direction.

Figure 3B:
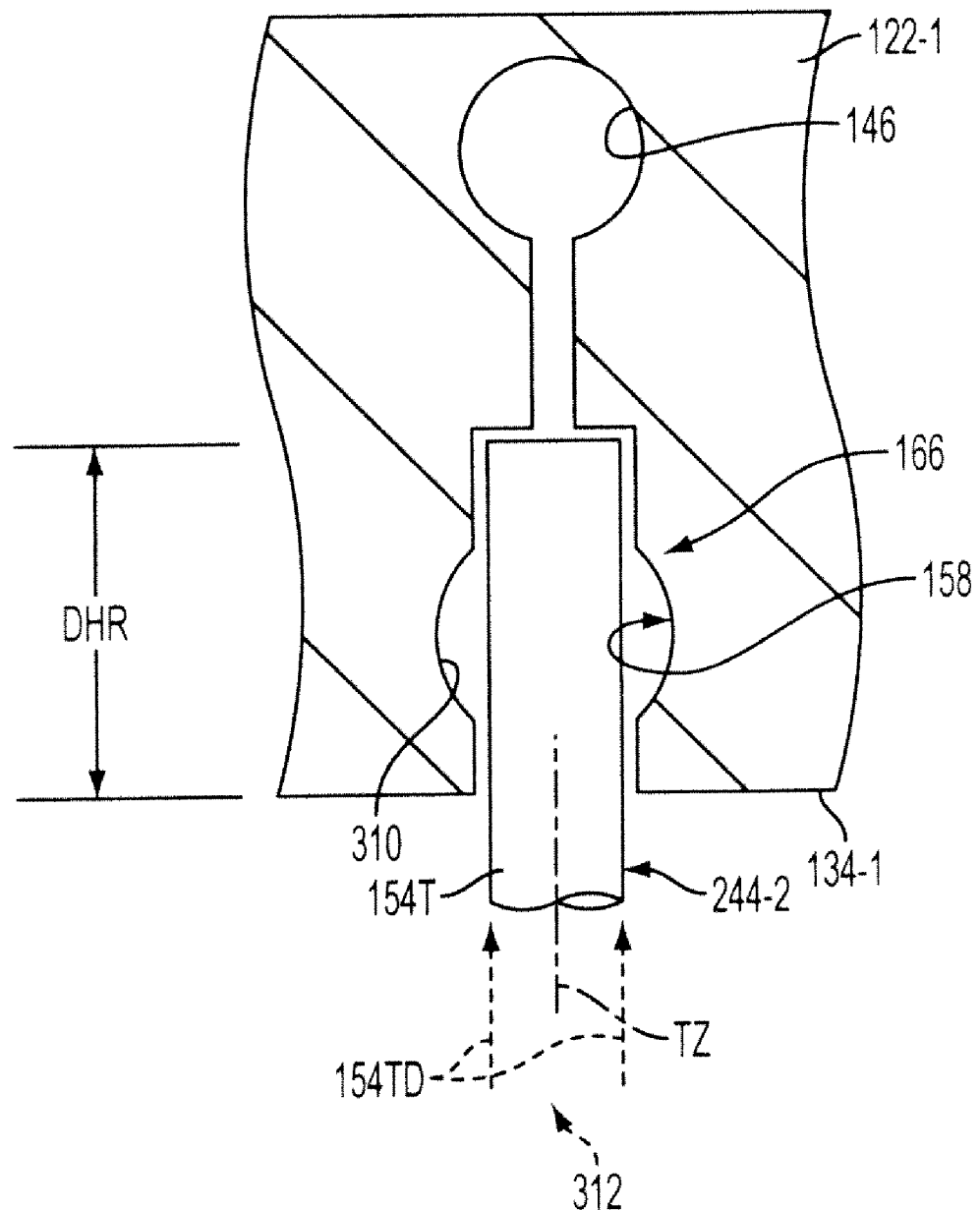

The method may move to an operation 140 of configuring a second block with a second mating surface and with a solid interior bounded on one side by the second mating surface and on an opposite side by a fluid transfer surface. For example, FIG. 4B shows the second block 122-2 with the second mating surface 134-2 and with the solid interior 136-2. Interior 136-2 is bounded on one side by the second mating surface 134-2 and on the opposite side by the fluid transfer surface, or face, 124B. Block 122-2 initially has a solid interior, e.g., interior 136-2, that is shown in FIG. 3B after configuration by operations of the method.

The method may move to performing a first series of operations 142 in the first block 122-1 according to low tolerances (as defined above). FIG. 3A shows that the first series of operations 142 may include an operation 144 of configuring a main fluid flow path extending through the first end surface into the first block and extending toward the second end surface 122-2. For example, FIG. 3A shows the configured main fluid flow path 146 extending through the first end surface 124S1 into the first block 122-1 and extending toward the second end surface 122-2.

The method may move to performing another of the first series of operations 142 in the first block 122-1 according to low tolerances, and in operation 148 there is configuring of a plurality of connector fluid flow paths in the first block. The connector fluid flow paths are connected to the main fluid flow path, the configuring of the connector fluid flow paths being performed by access to the first block through a plane of the first mating surface. For example, FIG. 3A shows the configured connector fluid flow paths 150 connected to the main fluid flow path 146. The configuring of the connector fluid flow paths 150 is performed by access to the first block 122-1 through plane P (that extends in the X and Y directions) of the first mating surface 134-1 (dashed arrow PA indicates such access).

The method may move to performing a second series of operations 152 in the first block according to high tolerances.

In the second series, in an operation 154 there is configuring of a high resistance fluid flow path in the first block. In one embodiment described below with respect to FIGS. 3A-3C, operation 154 performs this configuring through the first mating surface and the first end surface. In another embodiment described below, operation 154 performs this configuring through only the first mating surface.

Generally then, either configuring may be performed, and each defines the high resistance fluid flow path having a cross-shaped cross-section comprising a plenum and a resistance bore open to the plenum. The configuring of operation 154 configures the high resistance fluid flow path 156 in the first block 122-1. More specifically, FIG. 3A shows that in one embodiment operation 154 performs this configuring through the first end surface 122S1 to define one part of the high resistance fluid flow path 156, referred to as a central section 158. FIG. 3A also shows that in this embodiment operation 154 further performs this configuring of path 156 through the first mating surface 134-1. Path 156 defines other parts of the high resistance fluid flow path 156, referred to as upper plenum 160 and a portion 162 of a lower plenum 164. To configure the plenums 160 & 164, operation 154 is shown in FIGS. 3A & 3B introducing a tool 154T in the Z direction along axis TZ according to dashed lines 154TD. FIG. 3A shows tool 154T moving on the Y direction along the axis TY.

Figure 4A:
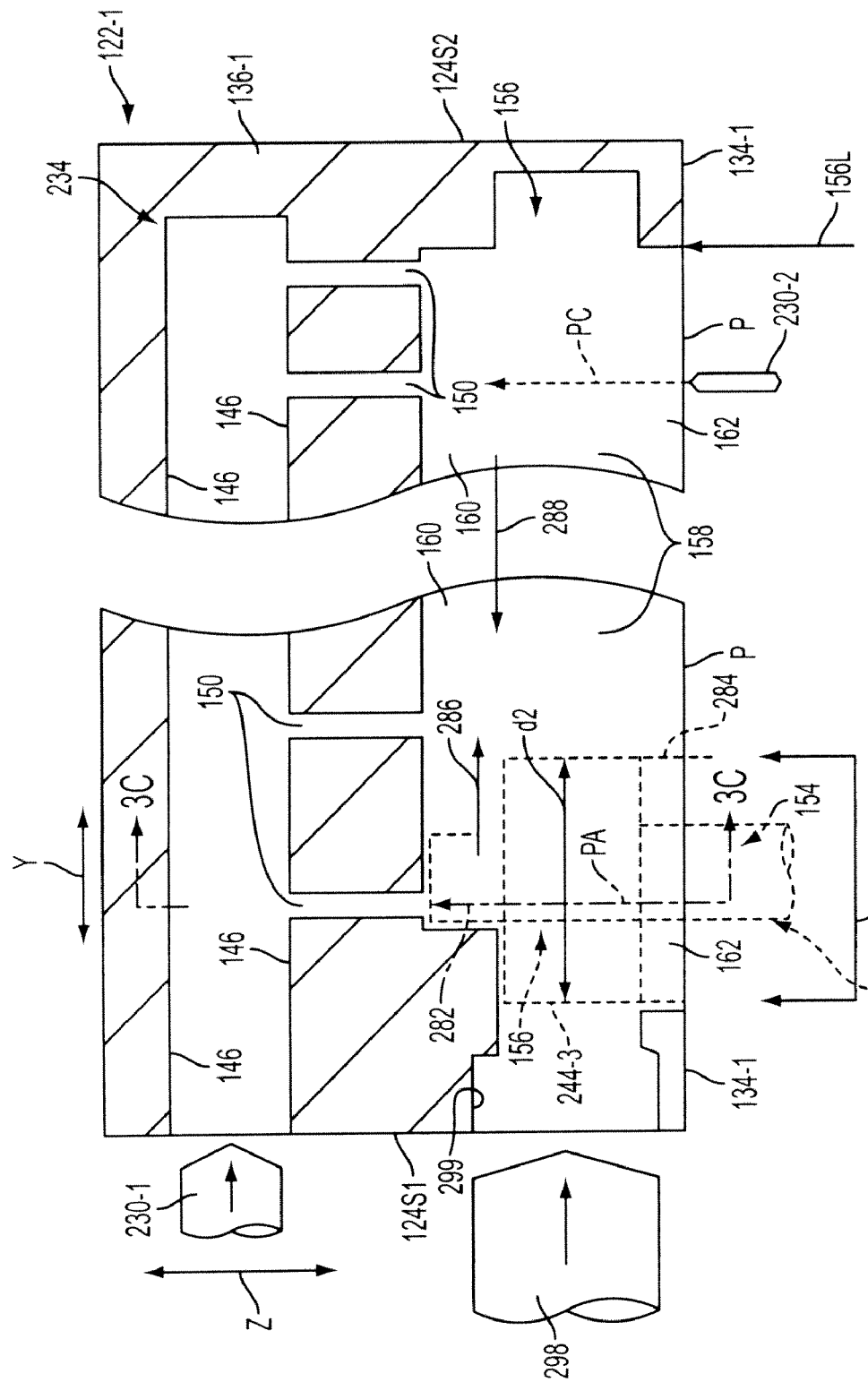
FIGS. 4A-4D are schematic diagrams of operations of configuring a fluid return unit of a proximity head according to an embodiment of the present invention.
Figure 4B:
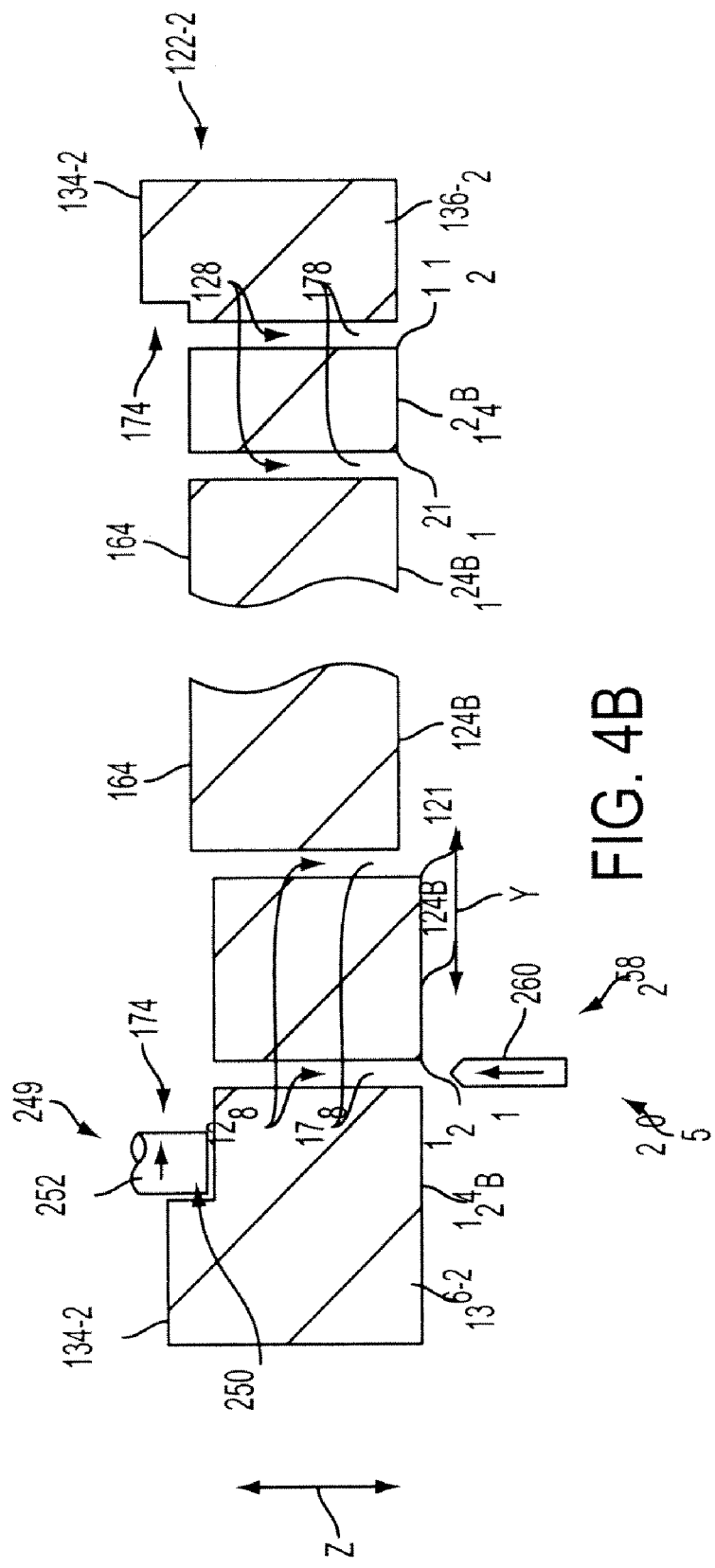

For the other embodiment, FIG. 4A shows operation 154 performs this configuring through only the first mating surface to define the central section 158, and plenum 160 and portion 162 of plenum 164. In each of these embodiments of this configuring, the high resistance fluid flow path 156 is defined with a cross-shaped cross-section (see bracket 166, FIG. 1C) comprising the plenum (e.g., upper) 160 and a resistance bore 168 open to the upper plenum 160. FIG. 1C also shows the high resistance fluid flow path 156 defined by the operation 154 with the cross-shaped cross-section 166 further comprising the lower plenum portion 162 that is also open to the resistance bore 168.

The method moves to performing a third series of operations 170 in the second block according to high tolerances. The third series of operations 170 includes an operation 172 of configuring a portion of the plenum through the second mating surface into the second block. The operation 172 is shown in FIG. 4B having configured a lower portion 174 of the plenum 164 through the second mating surface 132-2 into the second block 122-2. With blocks 122-1 & 122-2 apart, access is available to configure the lower plenum 164 via the second mating surface 134-2.

The method moves to an operation 176 of the third series of operation 170. Operation 176 configures a plurality of fluid transfer bores in the second block and intersecting the portion of the plenum and intersecting the fluid transfer surface to define the fluid transfer paths. FIG. 4B shows the configured plurality of fluid transfer bores 178 in the second block 122-2 intersecting the second portion 174 of the lower plenum 164 and intersecting the fluid transfer surface 124B to define the fluid transfer paths 128.

FIG. 3A, 4A, & 4B show other aspects of the respective first, second, and third series of operations 142, 152, and 170.

Each of the main fluid flow path 146, and high resistance fluid flow path 156, is shown configured extending in the Y direction. The paths 146 and 156 extend beyond the diameter D of the wafer 102, that also extends in the Y direction. With wafer 102 as shown in FIG. 1A, the paths 146 and 156 are opposite to the wafer 102 and extend completely across the diameter D of the wafer. Additionally, FIGS. 3A, 4A, & 4B show that the respective connector fluid flow paths 150, fluid transfer bores 178, fluid transfer flow paths 128, and ports 121 are spaced from each other in the Y direction. Based on ports 121 and the wafer diameter D shown in FIG. 1B, that spacing of the fluid transfer bores 178 and fluid transfer flow paths 128 is also opposite to the wafer 102 and completely across the diameter D of the wafer.

Referring again to the flow chart 130 of FIG. 2, the method moves to an operation 180 of fusing the first and second mating surfaces. Operation 180 renders the first and second blocks unitary with the plenum open to and between both the plurality of fluid transfer bores and the cross-shaped cross-section of the high resistance fluid flow path. FIG. 1C shows that the fusing operation 180 has joined the respective first and second mating surfaces 134-1 and 134-2. Such joining is illustrated by "xxx" marks adjacent to the now-fused surfaces 134-1 and 134-2. This joining has rendered the first and second blocks 122-1 and 122-2 unitary, i.e., in one piece. FIG. 1C shows that in the one-piece configuration of blocks 122-1 and 122-2, the material from which the blocks 122-1 & 122-2 were configured is now a continuous, single piece. Also, the plenum (i.e., the lower plenum 164, by way of portions 162 and 174) is open to and between both the plurality of fluid transfer bores 178 and the cross-shaped cross-section 166 of the high resistance fluid flow path 156.

Referring again to the flow chart 130 of FIG. 2, the method moves to an operation 182 of configuring a resistor for reception in the resistance bore. In operation 182 the resistor 184 is configured according to high tolerances. The resistor configuration is also to define in the resistance bore the high resistance fluid flow path 156 between the main fluid flow path 146 and the fluid transfer bores 178. The high resistance is relative to fluid flow resistance of (i) the main fluid flow path 146 and of the plurality of fluid transfer bores 178, and (ii) the connector fluid flow paths 150. In this manner, fluid flowing in each of the plurality of fluid transfer bores 178 will be at a flow rate value that is substantially uniform relative to the flow rate values of fluid flowing in all of the other fluid transfer bores 178.

FIG. 1D is an enlargement of a view similar to FIG. 1C, illustrating that the configured resistor of operation 182 is resistor 184 that in use is received in the resistance bore 168. In use, the configuration of the resistor 184 defines (in the resistance bore) 168 the high resistance fluid flow path 156. The high resistance imposed on the fluid flow between the main fluid flow path 146 and the fluid transfer bores 178 is thus relative to lower fluid flow resistance imposed on the fluid by the main fluid flow path 146 and by the connector fluid flow paths 150, and then by the plurality of fluid transfer bores 178. In this manner, the high resistance fluid flow path 156 is highest and causes the fluid flowing in each of the plurality of fluid transfer bores 178 of one unit 114 to be at a flow rate value that is substantially uniform relative to the flow rate values of fluid flowing in all of the other fluid transfer bores 178 of that unit 114.

The configuring of the proximity head 106 is described relative to the orthogonal X,Y and Z axes. For example, FIG. 1D shows that the configuring of operation 154 of the high resistance fluid flow path 156 in the first block 122-1 includes defining the resistance bore 168 at an intersection 186 of the cross-shaped cross-section (bracket 166). FIG. 1D further shows a defining of a cross-section of the resistance bore 168 as an exterior of the high resistance fluid flow path 156. Referring to FIG. 1B, in view of units 114 extending in the Y direction almost the entire head length LH, it may be understood that the configuring of the resistor 184 for reception in the resistance bore 168 includes configuring a cross-section of the resistor 184 to define an elongated exterior resistor surface configuration 188 (i.e., elongated in the Y direction).

Resistor 184 extends along and is uniform and closely-spaced from similarly elongated exterior 190 of the high resistance fluid flow path 156. In this manner, the resistor 184 is configured to define the high resistance fluid flow path 156 as a tortuous flow path (see 156T) extending around (i.e., along) the exterior resistor surface configuration 188. Path 156T is shown as extending successively in directions of the X axis and the Z axis and the X axis.

In one embodiment, the described general "transferring" of the fluid relative to the head 106 in the plurality of fluid transfer flow paths 128 (i.e., in the bores 178) is transfer of the fluid out of the head 106, i.e., for fluid supply to the meniscus 108. For such transfer, operation 154 defines the exterior 190 as a circular exterior of the high resistance fluid flow path 156. In this embodiment, the operation 182 configures the resistor 184 to define a circular configuration of the resistor surface configuration 188. In this embodiment, the high resistance fluid flow path 156 is defined as a pair of the tortuous flow paths 156T each extending around (i.e., along) portions of the circular resistor surface configuration 188, and those portions respectively extend clockwise and counterclockwise, each successively in directions of the X axis and the Z axis and the X axis.

In one embodiment, the described general "transferring" of the fluid relative to the head 106 in the plurality of fluid transfer flow paths 128 (i.e., in the bores 178) is transfer of the fluid into the head 106, i.e., for fluid return from the meniscus 108 to the head 106. In this embodiment, FIG. 1D shows that operation 182 configures the resistor 184 to define a linear exterior 188 of the high resistance fluid flow path 156. In this embodiment, the cross-section of the resistance bore 168 is defined by the linear exterior 190 of the high resistance fluid flow path 156, and the configuring of the resistor 184 defines the linear resistor external surface configuration 188 of the resistor 184. Surface configuration 188 extends along and is uniformly and closely-spaced from the linear exterior 190 of the high resistance fluid flow path 156. In this embodiment, FIG. 1D shows the tortuous flow path 156T of the fluid flow path 156 as being defined as extending linearly in successive directions of the X axis and the Z axis and the X axis.

Reference is again made to the above-described analysis indicating the need for configuration of the proximity head 106 in one piece, while meeting requirements for fluid transfer and maintaining head rigidity even as the head 106 is lengthened for cleaning of wafers 106 with larger and larger diameters D. In one embodiment, one aspect of meeting these needs relates to the operations 132 and 140 of configuring the first and second blocks 122-1 and 122-2 to configure each block from the same material. Consistent with an additional requirement that the material from which the head 106 is configured be compatible with the fluids to be transferred, operation 132 and 140 of this embodiment may take the head material from the group consisting of: poly vinylidine difluoride, and ethylene-chlorotrifluoroethylene. Also, the configuring of the proximity head 106 may be relative to the orthogonal X, Y and Z axes, and as shown in FIG. 1A the proximity head 106 is configured to extend completely across the wafer 102 having the surface 104 with the diameter D extending in a direction of the Y axis.

In this embodiment, the Y extent of units 114 is shown extending beyond diameter D. This indicates that the operation 154 of configuring the units 114 with the high resistance fluid flow path 156 in the first block 122-1, defines the high resistance fluid flow path 156 extending elongated in the direction of the Y axis for an extent equal to at least the diameter D of the wafer 102. Also, FIG. 4B shows that operation 176 of configuring the plurality of fluid transfer bores 178 extends the bores in the head 106 spaced from each other in the Y axis direction. As indicated by FIG. 1B, this is for an extent at least equal to the diameter D of the wafer 102. The fluid transfer flow paths 128 are defined so that fluid flowing in each of the plurality of fluid transfer bores 178 will be at a flow rate value that is substantially uniform relative to the flow rate values of fluid flowing in all of the other fluid transfer bores 178 of the unit 114 across the diameter D.

FIGS. 1C & 1D also relate to one embodiment in which the exemplary operations 132 and 140 configure the first and second blocks 122-1 and 122-2, respectively, from the same material taken from the above-defined group.

Figure 5:
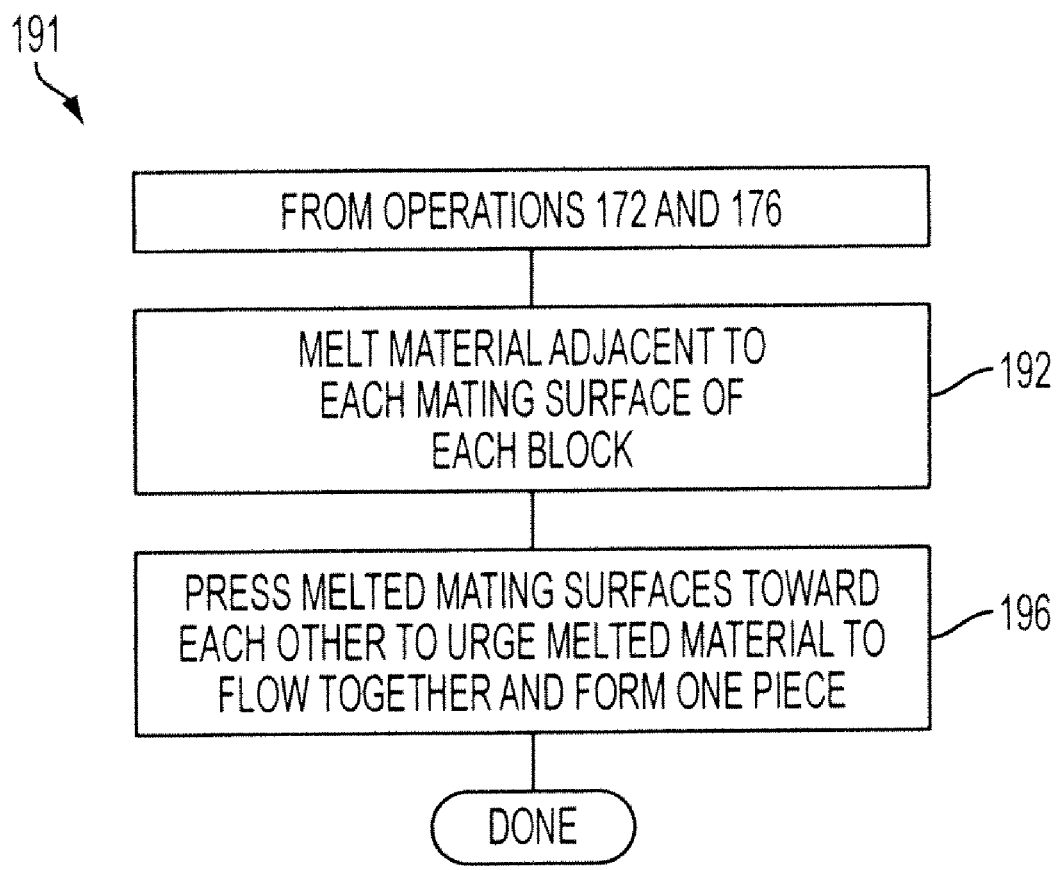
FIG. 5 is a diagram of a flow chart illustrating operations of a method of fusing two blocks to configure a one-piece proximity head in an embodiment of the present invention.

By the rows of "xxxx . . . ", FIGS. 1C & 1D indicate other aspects of operation 180 of fusing. Flow chart 191 of FIG. 5 generally includes a further operation 192 of melting the material adjacent to each of the mating surfaces. FIG. 1D shows that the operation 192 of melting the material occurs at a location 194 adjacent to each of the mating surfaces 134-1 and 134-2. FIG. 5 further shows that the operation 180 of fusing additionally includes an operation 196 of pressing the respective melted mating surfaces (shown as 134-1M and 134-2M) of the blocks toward each other to urge the respective melted material to flow together and form the blocks 122-1 and 122-2 into one piece.

Figure 6:
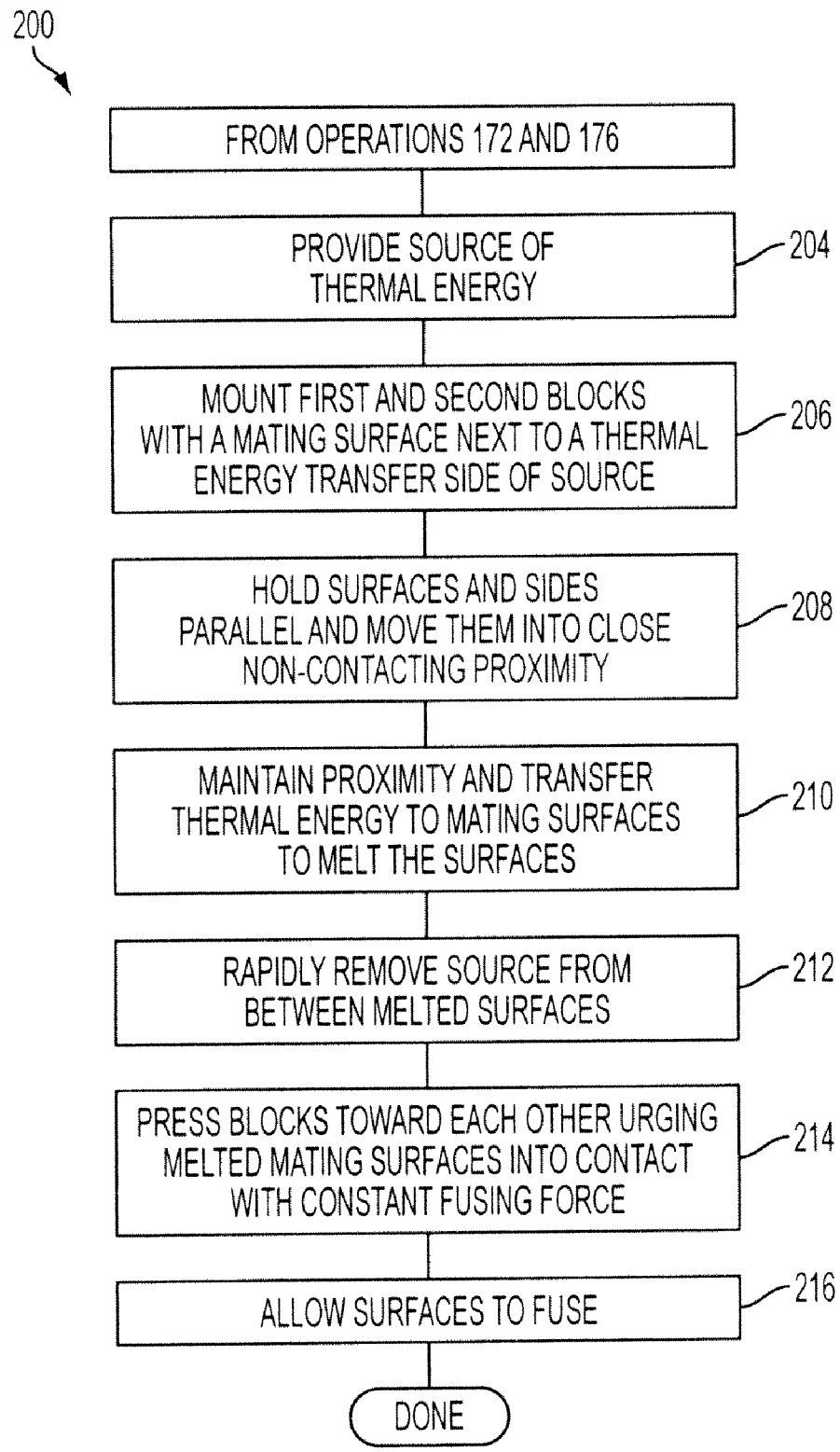
FIG. 6 is a diagram of a flow chart illustrating further operations of the method of fusing two blocks to configure a one-piece proximity head in an embodiment of the present invention.

A flow chart 200 of FIG. 6 shows that in one embodiment, the method operation 180 may be understood in more detail as including operation 202 of providing a source of thermal energy, the source having a thermal energy transfer side corresponding to each of the respective mating surfaces. The surfaces may be of a flat hot plate having a first thermal energy transfer side corresponding to the mating surface 122-1 and a thermal energy transfer side corresponding to the mating surface 122-2. The operation 180 of the method moves to an operation 206 of mounting the blocks with each of the respective thermal energy transfer sides adjacent to one of the mating surfaces 134-1 or 134-2. Operation 206 mounts the blocks 122-1 and 122-2 with each of the respective mating surfaces 134-1 and 134-2 next to one of the thermal energy transfer sides.

Operation 180 of the method moves to an operation 208 of holding each of the respective mating surface and respective thermal transfer side parallel while moving the surface and side into close non-contacting proximity. Such close non-contacting proximity may be set by steps that limit block movement, for example. The operation 208 of the method moves to an operation 210 of maintaining the close non-contacting proximity of each respective mating surface and respective thermal transfer side while transferring thermal energy to each respective mating surface to melt each respective mating surface.

Operation 210 may transfer thermal energy to the respective mating surface 134-1 during a time period, e.g., of about 50 seconds. Operation 212 rapidly removes the source from between the respective mating surfaces without contacting the respective mating surfaces. The method moves to an operation 214 of pressing the blocks toward each other to urge the melted mating surfaces into contact with each other with a constant fusing force. For the pressing, constant fusing forces F press the blocks 122-1 and 122-2 toward each other to urge melted mating surfaces 132-1M and 132-2M into contact with each other. The method moves to an operation 216 of allowing the melted and urged mating surfaces to remain in contact in response to the constant fusing forces until the urged mating surfaces have fused. The pressing may continue, for example, for a period of 5 minutes. The fusing may be followed by a cooling-off period, such as 24 hours, and the operation 180 is done.

In describing the flow chart 130 of FIG. 2, reference was made to various operations of "configuring". One embodiment of such configuring may be understood by reference to FIG. 7 that shows a flow chart 220 describing operations of an embodiment of a method of configuring the proximity head 106 for transferring fluid between the head and the wafer 102. In this embodiment, in configuring, reference is made to the use of tools to implement certain operations, the tools may be as defined above, and the use of the tools may be according to either low or high tolerances.

In this embodiment, the configurations resulting from such use of the tools transfer fluid in the plurality of fluid transfer flow paths 128 that extend across the diameter D of the wafer 102. Also, the flow rate of fluid in each of the flow paths 128 of a particular unit 114 is at a value that is substantially uniform relative to the values of the flow rates in the other fluid transfer flow paths 128 of the same unit 114, wherein those flow paths 128 extend across the wafer diameter D. Also, the fluid is characterised by being compatible with a limited group of materials. The method of this embodiment may include an operation 222 of configuring a first block with a first planar mating surface and with a solid interior bounded on one side by the mating surface and bounded by spaced first and second end surfaces extending transversely of the mating surface, the first block being made from a material within the limited group of materials.

The method may move to an operation 224 of configuring a second block with a second planar mating surface and with a solid interior bounded on one side by the second mating surface and bounded on an opposite side by a fluid transfer surface, the second block being made from the same material from which the first block is made. Operations 222 and 224 may be understood from reference to FIG. 3A in which the first block 122-1 is shown configured with a first planar mating surface 134-1 and the solid interior 136-1 bounded on one side by the mating surface 132-1 and bounded by the spaced first and second end surfaces 124S1 and 124S2 extending transversely of the mating surface. Also, the first block 122-1 is made from a material within the limited group of materials, and may be a material taken from the group consisting of: poly vinylidine di-fluoride, and ethylene-chlorotrifluoroethylene. The configured second block 122-2 may be understood from this description of block 122-1, and by reference to FIG. 4B.

The method of flow chart 220 moves to an operation 226 of performing a first series of operations in the first block using a first set of tools, the use of the first set of tools being according to low tolerances with respect to machining the material. Operation 226 performs the first series of operations in the first block 122-1 using a first set 228 of tools 230. The use of the first set 228 is according to the low tolerances described above with respect to machining the material. The operations 226 of the first series include an operation 232 of first moving a first tool of the first set through the first end surface to define a main fluid flow path in the first block. The main fluid flow path extends from the first end surface to a location adjacent to the second end surface. FIGS. 3A and 4A show the operation 226 of the first series including an operation 232 of first moving a first tool 230-1 of the first set 228 through the first end surface 124S1 to define a main fluid flow path 146 in the first block 122-1, the main fluid flow path 146 extending from the first end surface 124S1 to a location 234 adjacent to the second end surface 124S2.

The operations 226 move to an operation 236 of second moving a second tool of the first set through a plane defined by the first mating surface to define the plurality of connector bores, or paths, in the first block and connected to the main fluid flow path, the plurality of connector bores being spaced from each other in a direction parallel to the first mating surface (e.g., in the Y direction). FIG. 4A shows the operation 236 of moving a second tool 230-2 of the first set 228 along an axis PC through the plane P defined by the first mating surface 134-1 to define the plurality of connector bores, or paths, 150 in the first block 122-1 and connected to the main fluid flow path 146. By indexing the tool 230-2, the plurality of connector bores 150 may be spaced from each other in a direction parallel to the first mating surface 134-1 (e.g., in the Y direction).

The method moves to an operation 240 of performing a second series of operations in the first block using a second set of tools, the use of the second set of tools being according to high tolerances with respect to machining the material. The operation 240 of the second series includes an operation 242 of third moving one or more third tools of the second set. The third moving of operation 242 is through either (a) the first mating surface and the first end surface, or (b) the first mating surface. This third moving defines a high resistance fluid flow path in the first block, the high resistance fluid flow path having a cross-shaped cross section comprising a first plenum and a first portion of a second plenum and a resistance bore having one side open to the first plenum and having a second side open to the first portion of the second plenum.

FIG. 3A shows operation 242 moving one or more third tools (e.g., 244-1 and 244-2) of the second set 246 when the moving is through the first mating surface 134-1 and through the first end surface 124S1. FIGS. 4A & 4B show operation 242 moving one third tool (e.g., 244-3) of the second set 246 when the moving is only through the first mating surface 134-1. In each embodiment of the operation 242 of third moving, there is defined the high resistance fluid flow path 156 in the first block 122-1. The path 156 has the cross-shaped cross-section 166 comprising the first (upper) plenum 160 and the first portion 162 of the second (lower) plenum 164. Cross-section 166 includes the resistance bore 168 having one side open to the first plenum 160 and having the second side open to the first portion 162 of the second plenum 164.

The method moves to performing a third series of operations 248 in the second block using a third set of tools, the use of the third set of tools being according to high tolerances with respect to machining the material. The operations 248 of the third series include an operation 249 of extending a fourth tool of the second set through the second mating surface to define a second portion of the second plenum. FIG. 4B shows operation 249 in the second block 122-2 using a third set 250 of tools, the use of the third set of tools being according to high tolerances with respect to machining the material.

The operation 249 extends a fourth tool 252 of the third set 250 through the second mating surface 132-2 to define the second portion 174 of the second plenum 164. The method moves to operation 258 of extending a fifth tool of the third set through the second block to define a plurality of fluid transfer bores that intersect the second portion of the second plenum, the plurality of fluid transfer bores being spaced from each other in a direction parallel to the first mating surface and extending completely across the wafer diameter. FIG. 4B shows operation 258 extending the fifth tool 260 of the third set 262 through the second block 122-2 to define the plurality of fluid transfer bores 178 that intersect the second portion 174 of the second plenum 164. By indexing the tool 260, the plurality of fluid transfer bores 178 may be spaced from each other in the direction parallel to the first mating surface 132-1 and extend completely across the wafer diameter D.

The method moves to an operation 264 of fusing the first and second mating surfaces to join the first and second blocks into one unit having the portions of the second plenum joined and connecting the plurality of fluid transfer bores and the cross-shaped cross-section of the second fluid flow path. FIGS. 5 & 6 illustrate how operation 264 may perform the fusing. FIG. 1C shows that after operation 264 has fused the first and second mating surfaces 134-1 and 134-2, the first and second blocks 122-1 and 122-2 remain joined in one unit (see fusing indicated by "xxx"). Also, portions 162 and 174 of the second plenum 164 are shown joined. The joined blocks connect the fluid transfer bores 178 and the cross-shaped cross-section 166 of the high resistance fluid flow path 156.

The method moves to an operation 266 of configuring a resistor for reception in the resistance bore, the resistor configuring being according to high tolerances to define the high resistance fluid flow path as a fluid flow path of high fluid flow resistance between the main fluid flow path and the fluid transfer bores. The high resistance is in relation to fluid flow resistance of (a) the main fluid flow bore and of the connector fluid flow paths, and (b) the fluid transfer bores.

This high resistance is provided so that fluid flowing in each of the plurality of fluid transfer bores of one unit 114 will be at a flow rate having a value that is substantially uniform relative to the value of the flow rates of fluid flowing in all of the other fluid transfer bores of that unit extending completely across the wafer diameter. Operation 266 may be understood from the above description of operation 182 (FIG. 2) in which the resistor 184 is configured for reception in the resistance bore 168. The resistor 184 is configured according to the high tolerances to define the high resistance fluid flow path 156 as a fluid flow path of high fluid flow resistance between the main fluid flow path 146 and the fluid transfer bores 178. The referenced highest resistance is in relation to the fluid flow resistance of: (a) the main fluid flow, bore or path, 146 and of the connector fluid flow paths 150, and (b) the fluid transfer bores 178.

Thus, the fluid flow resistance of the path 156 exceeds the fluid flow resistance of each of paths 146, 150, and 178. This high resistance is provided so that fluid flowing in each of the plurality of fluid transfer bores 178 on one unit 114 will be at a flow rate having a value that is substantially uniform relative to the value of the flow rates of fluid flowing in all of the other fluid transfer bores 178 of the one unit 114 extending completely across the wafer diameter D. The method is done.

Figure 4C:
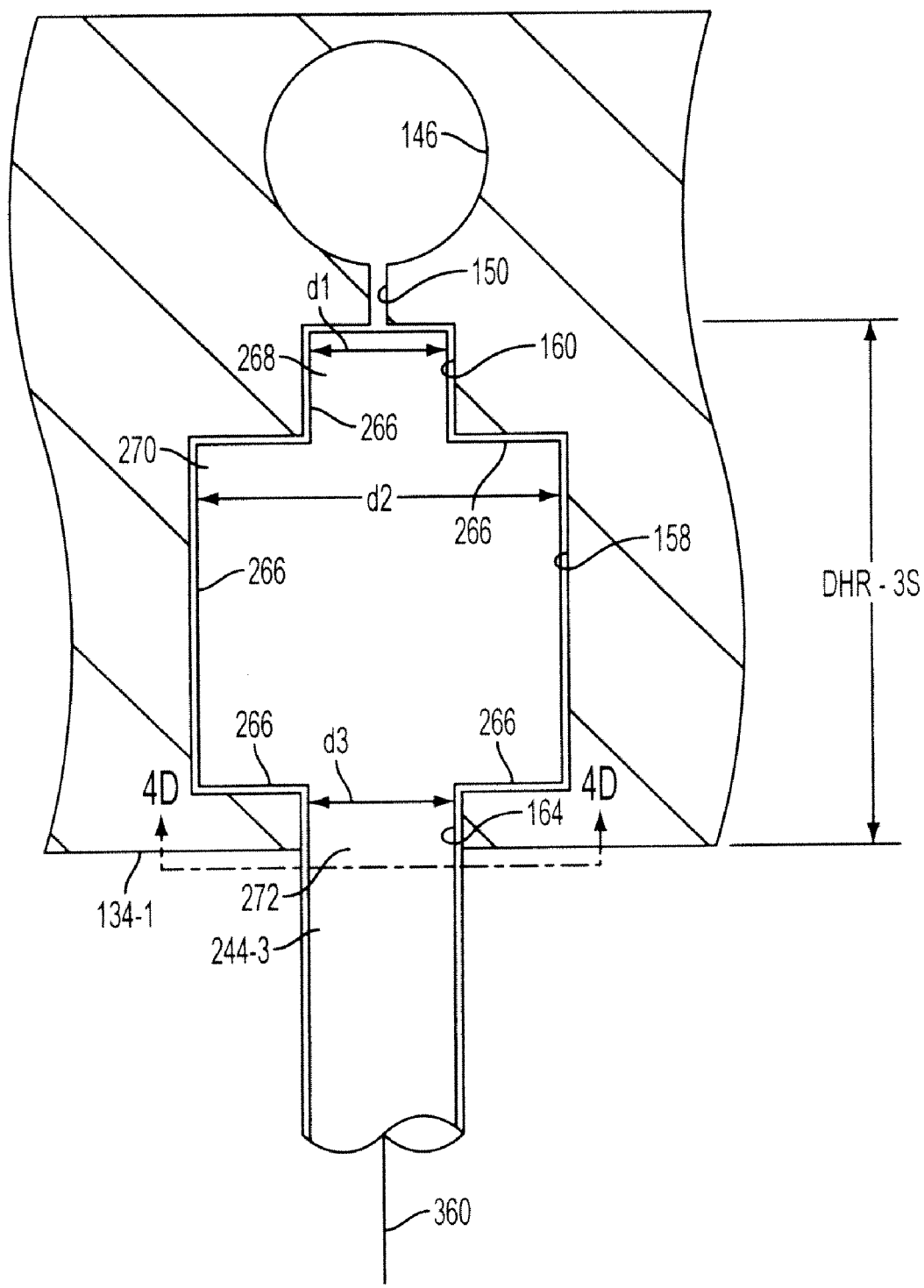

FIG. 4A shows that in one embodiment, the third moving of operation 242 moves the one third tool 244-3 through the first mating surface 134-1. FIG. 4C shows the one third tool 244-3 configured with a cross-shaped cross-section 266 comprising a first cylindrical portion 268 having a first diameter d1, and a second cylindrical portion 270 having a second diameter d2 greater than the first diameter d1, and a third cylindrical portion 272 having a third diameter d3 the same as the first diameter d1, the second portion 270 being between the first portion 268 and the second portion 272.

The use of the third tool 244-3 is in terms of a four stage, or operation, movement. A first stage, or operation, (see arrow 282, FIG. 4A) of the movement is movement through the first mating surface into the first block to configure an access bore, the access bore having a cylindrical configuration with the second diameter. Operation 282 is shown in FIG. 4A as being movement of tool 244-3 in the direction along axis PA through the first mating surface 134-1 into the first block 122-1 to configure the access bore 284 at a location 285. The access bore 284 has a cylindrical configuration with the second diameter d2. The second stage of the movement (arrow 286, FIG. 4A) is moving the third tool in the first block away from the access bore parallel to the first mating surface to configure the high resistance fluid flow path elongated parallel to the first mating surface and having the cross-shaped cross section. FIGS. 4A & 4C show stage 286 as moving the third tool 244-3 in the first block 122-1.

In FIG. 4A arrow 284R indicates movement away from the access bore 284 parallel to the first mating surface 134-1 to configure the high resistance fluid flow path 156 elongated parallel to the first mating surface 134-1 and having the cross-shaped cross section 166 of path 156. Path 156 extends to a location 156L at the right side of FIG. 4A. The third stage (arrow 288, FIG. 4A) of the movement is moving the third tool in the elongated high resistance fluid flow path back toward and into alignment with the access bore. FIG. 4A shows operation 288 moving the third tool 244-3 in the elongated high resistance fluid flow path 156 back from location 156L toward, and again into alignment with, the access bore 284 at location 285. Stage 290 (not shown) is the reverse of stage 282 and removes the third tool 244-3 from the access bore 284 and out of the first block 122-1 to define an open end 294 of the access bore 284.

Figure 4D:
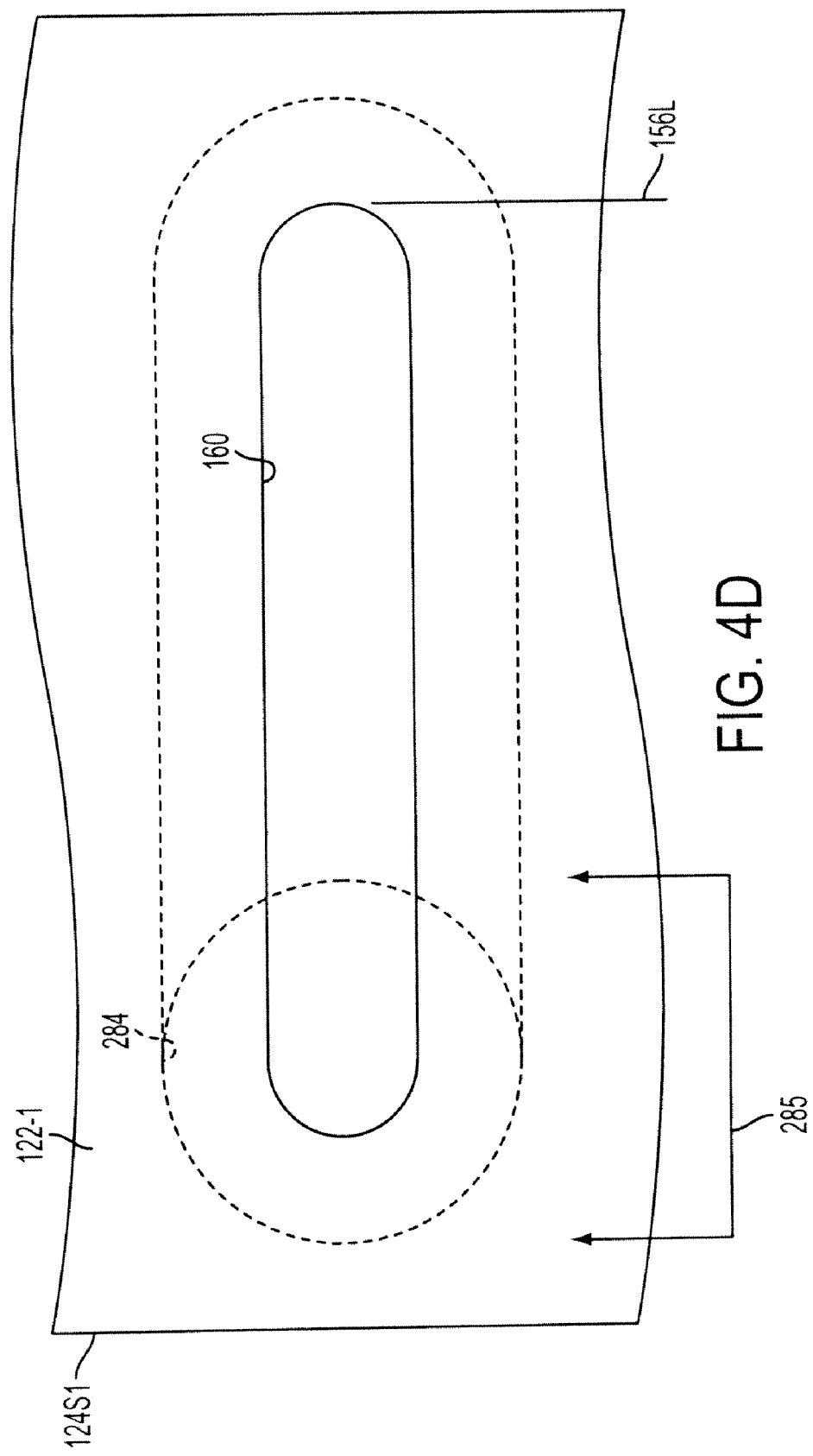

FIG. 4C shows that in moving between locations 285 and 156L in stage 286, the tool 244-3 defines the cross-shaped cross-section 166 of path 156. The upward view of FIG. 4D also shows that access bore 284 is adjacent to end face 124S1 of block 122-1. The straight dashed 293 also indicate the path of the section 270 of diameter d2 of tool 244-3 in stage 286 to configure the path 156.

FIG. 4C shows that section 270 of tool 244-3 stays above the mating line 134-1 during stage 286, such that tool 244-3 only configures upper plenum 160 (FIG. 1D) between section 270 and the mating surface 134-1. In view of how the access bore 284 is formed, it may be understood that once the tool 244-3 has been removed from the bore 284 and the other tooling operations have been completed, the operation 264 of fusing is effective to align, or position, the second planar mating surface 134-2 across the open end of the access bore 284 to close the access bore 284. In this manner, the blocks 122-1 and 122-2 in the one-piece configuration do not allow fluid transfer through the access bore 284.

Figure 8:
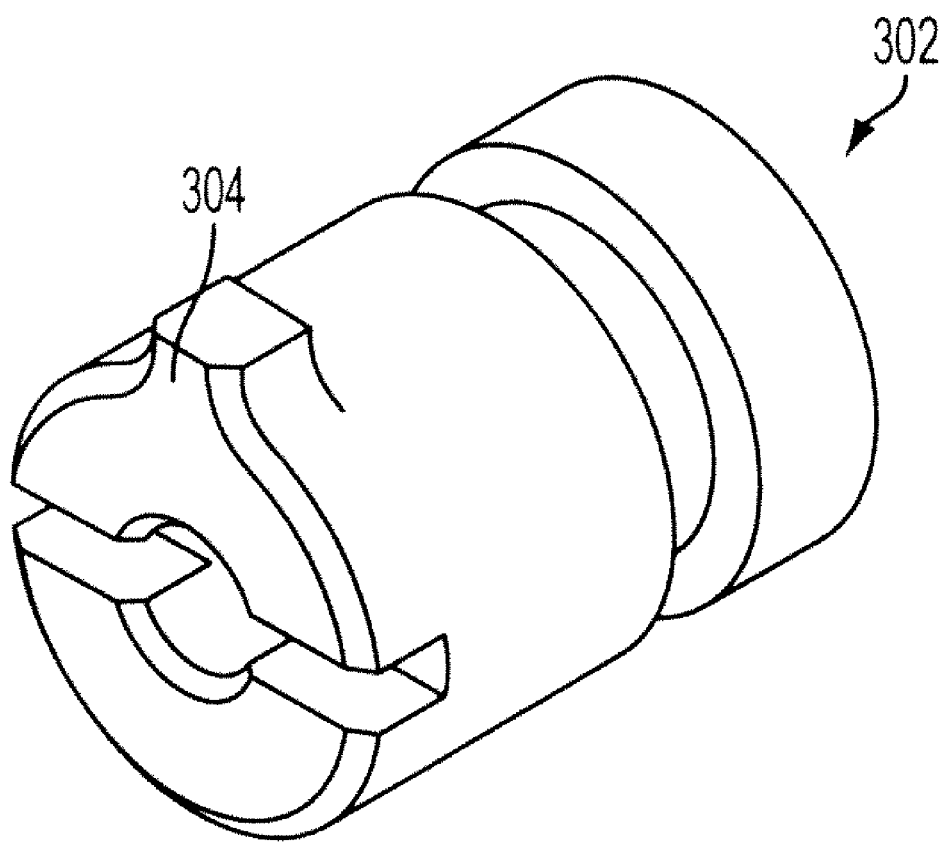
FIG. 8 is an illustration of a configuration of a plug for retaining the resistor in the head according to the embodiments of the present invention.

Referring to FIGS. 3A & 4A, one of the operations performed before the fusing operation 264 may be performed after the fourth stage 290 of the movement of tools 244-1 & 244-3. For example, another operation of the second series of operations 240 may extend another circular tool 298 of the second set 246 through the first end surface 124S1 and into intersection with high resistance fluid flow path 156 to define a larger diameter, short bore 299. A plug (302, FIG. 8) is then configured according to high tolerances for insertion into the bore 299 to close the first block 122-1 between the first end surface 124S1 and the high resistance fluid flow path 156. In this manner, once the resistor 184 has been inserted into the bore, or path 156, the plug 302 closes the path 156 and may be rotated to engage a plug tab 304 in a groove of the block 122-1 to retain the plug 302 and resistor 184 in the bore 156.

In one embodiment, when the blocks 122-1 and 122-2 are formed into one piece, the first portion 162 and second portion 174 of the second plenum are joined to define the second plenum 164.

Figure 3C:
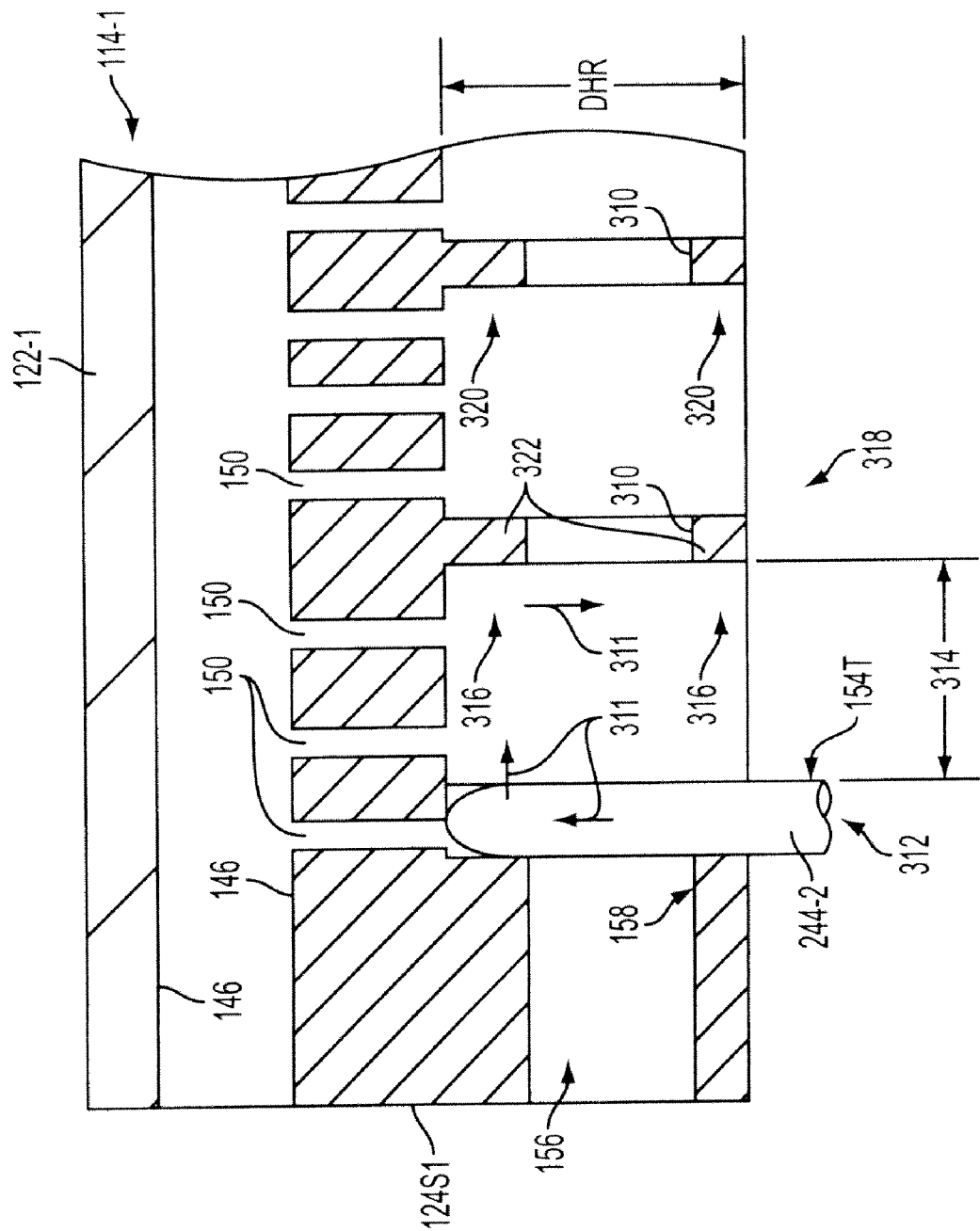

In an embodiment described above, FIG. 3A shows that operation 242 of third moving includes extending the tool 244-1 as a circular tool of the second set 246 through the first end surface 124-S1. FIG. 3B shows that such tool 244-1 thus defines a circular cross-section as the central section 158 (or center 310) of the cross-shaped cross-section 166 of the high resistance fluid flow path 156. In this embodiment, the path 156 may be part of the supply unit 114-1 shown in FIG. 1B as extending adjacent to rear face 124R. Another embodiment of operation 242, also for unit 114-1, is shown in FIG. 3C and reference is made to movement arrows 311.

Operation 242 also extends the tool 244-2 (here identified as a plenum tool and being an embodiment of tool 154T) through the first mating surface 134-1 into intersection with and beyond the center 310 of the cross-shaped cross-section 166 of the high resistance fluid flow path 156 to a first depth DHR. The extending of the plenum tool 244-2 is at a first location 312 between the faces 124S1 and 124S2. In this embodiment, operation 242 also moves the plenum tool 244-2 away from the first end surface 134-1 toward the second end surface 134-2 and at the first depth DHR and for a first distance 314 that is short relative to the head length HL between the spaced first end 124-1 and second end 124-2. Operation 242 then removes tool 244-2 from the block 122-1.

This part of operation 242 has defined a first plenum section 316 of the high resistance fluid flow path 156. In this embodiment, operation 242 also removes the plenum tool 244-2 from the first block 122-1 after the move through short distance 314. In this embodiment, operation 242 repeats the operations (arrows 311) of extending the plenum tool 244-2 and moving the plenum tool 244-2 and removing the plenum tool 244-2, the repeating starting at a second location 318 spaced from the first location 312 toward the second end surface 124-2 by more than the short distance 314. The repeated movement defines a second plenum section 320 of the high resistance fluid flow path 156 so that a bridge 322 is defined between the respective first and second plenum sections 316 and 320 of the high resistance fluid flow path 156. These aspects of operation 242 may be repeated and thus space many bridges 322 across the length of the high resistance fluid flow path 156 to support the block 122-1 adjacent to the path 156 and plenums 160 and 164.

Figure 3D:
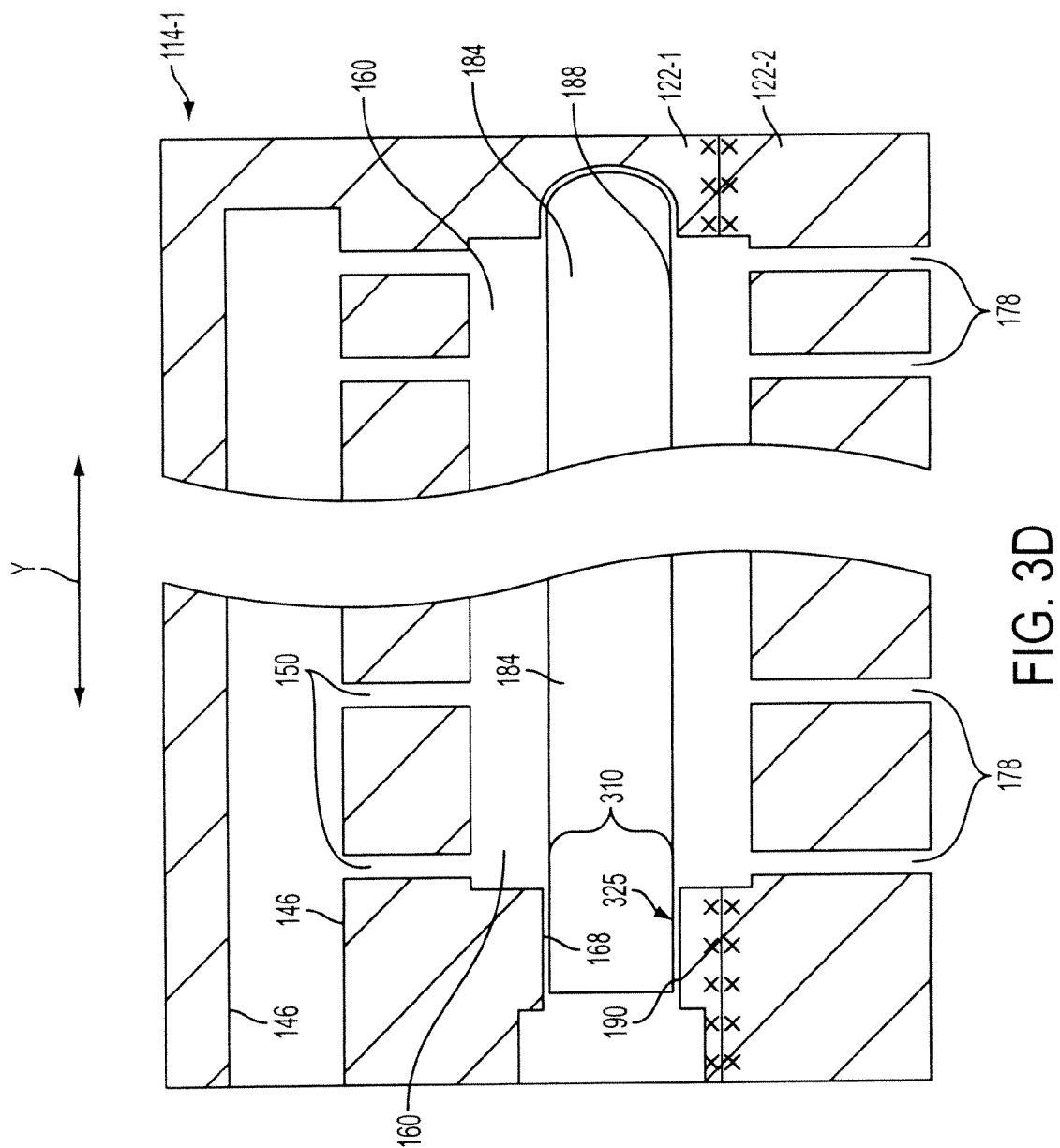
FIG. 3D is a cross-section of supply unit shown in FIG. 1B, illustrating a resistor received in the unit.
Figure 3F:
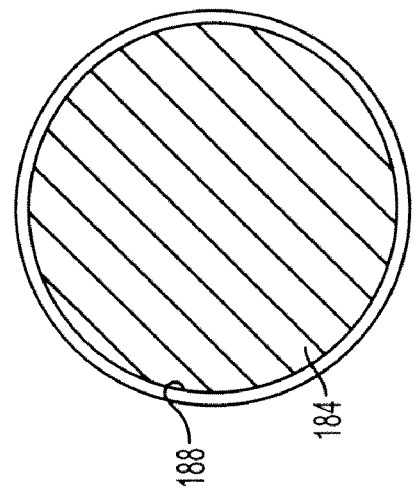
FIGS. 3E & 3F illustrate configurations of the resistor according to the embodiments of the present invention.
Figure 3E:
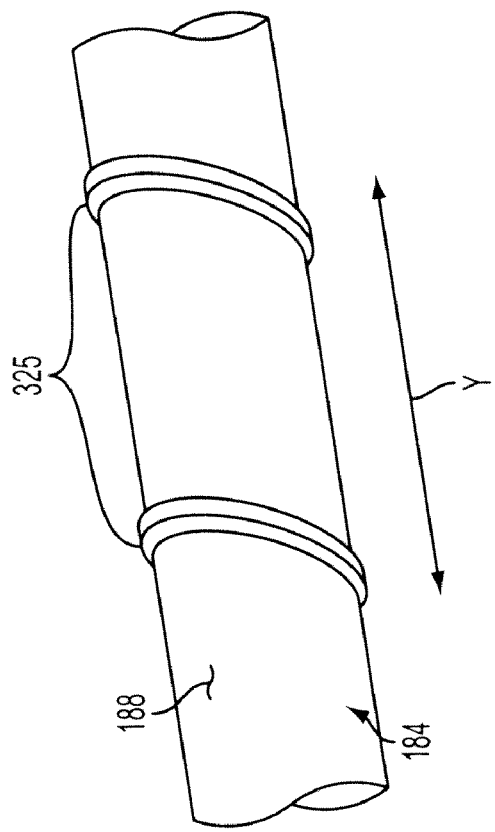
Figure 7:
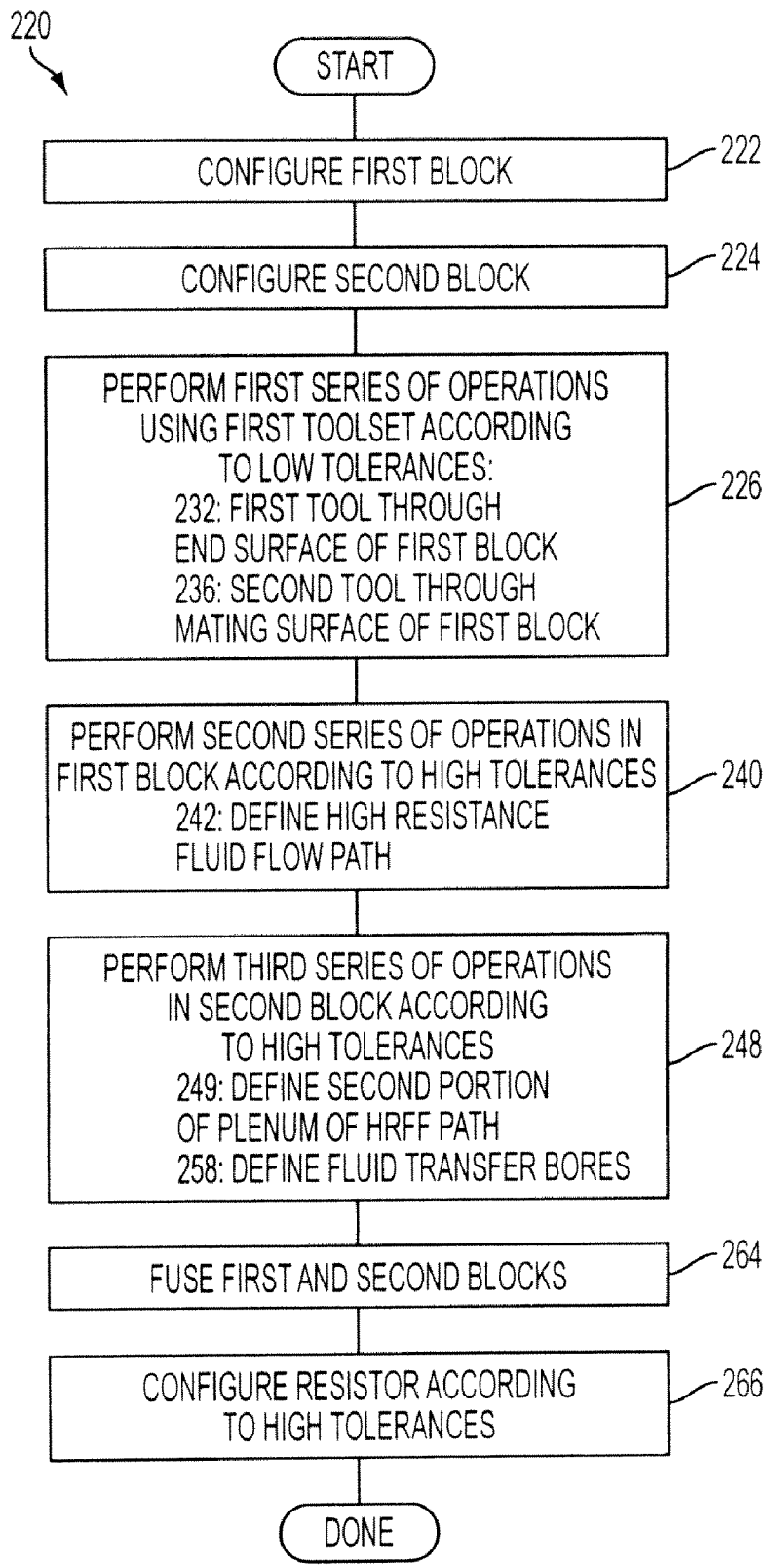
FIG. 7 is a diagram of a flow chart illustrating operations of a method of an embodiment of the present invention in which operations are performed according to low and high tolerances.

In one other embodiment, the method of FIG. 7 may perform operation 242 in the following manner. The one or more other third tools 244-1 and 244-2 and 244-3 may be selected to configure the exterior surface 190 of the resistance bore (or path) 156 as one of a respective circular or square or rectangular resistance bore. The tool selection may be according to which cross-section is to be provided for the cross-shaped cross-section 166, for example. The circular tool 244-1 has been described with respect to FIG. 3A, and is used to configure the circular cross-section, or center, 310 (FIG. 3B) of central section 158 of path 156. FIG. 3D illustrates the fused blocks 122-1 and 122-2, showing that the tool 244-1 has been removed from the block 122-1, and that after the operation 182 of configuring the resistor 184, the resistor may be inserted into the center (here identified by bracket 310). FIGS. 3E & 3F show how operation 182 configures the resistor 184, which is elongated in the Y direction. FIG. 3D shows the resistor 184 extending opposite to all of the plurality of fluid transfer bores 178 that are spaced from each other in the Y axis direction parallel to the first mating surface 134-1.

Operation 182 is further shown in FIGS. 3E & 3F having configured an exterior surface 188 of the resistor 184, and ribs 325 extend around the surface 188 at spaced locations. In FIG. 3D, surface 188 is shown corresponding to and smaller than the exemplary circular resistance bore 168. FIG. 3D shows the ribs 325 extending away from the exterior resistor surface 188 to engage the exterior surface 190 of the resistance bore (or path) 156 and closely and uniformly separate the exterior resistor surface 188 and the exterior surface 190 of the resistance bore 168.

As described above, the selection of one of the tools 244-1 through 244-3 may be according to which cross-section is to be provided for the cross-shaped cross-section 166. Further to the selection of the tool 244-3 according to which cross-section is to be provided for the cross-shaped cross-section 166, in one embodiment operation 242 may use the tool 244-3 shown in FIG. 4C configured with an axis 360 of rotation and with symmetry around the axis 360. The symmetry defines a tool cross-section that corresponds to the desired cross-shaped cross-section 166.

Referring to the above-described tool 244-3 with cylindrical portion 268 of first diameter d1, and second cylindrical portion 270 having a second diameter d2 greater than the first diameter d1, and third cylindrical portion 272 having a third diameter d3 the same as the first diameter d1, the second portion 270 was between the first portion 268 and the second portion 272. This symmetry around axis 360 results in a cross-shaped cross-section 166 having a square center when the symmetry around the axis 360 is configured with an axial length SL equal to the diameter d2, and such tool 244-3 is referred to as third tool 244-3S.

In this embodiment with the square center of the cross-shaped cross-section 166, in the operation 242 there is a move (arrow 282, FIG. 4A, shown with tool 244-3) of the third tool 244-3S parallel to the axis 360 through the first mating surface 134-1 into the first block 122-1 to a depth DHR-3S at location 285. At this depth, the first (upper) plenum section 160 and the center 158 of the resistance bore cross-section 166 are fully received in the first block 122-1. At this depth, the tool section 272 is positioned to configure portion 162 of the second (lower) plenum 164 in the first block. The lower (second) portion 174 of plenum 164 is not configured in the first block 122-1. The moving third tool 244-3S (arrow 282, FIG. 4A) configures the access bore 284 in the first block 122-1. In this embodiment with third tool 244-3S, the move of the third tool is further at the depth DHR-3S and perpendicular to the axis 360 (arrow 286) away from the access bore 284 and along a path parallel to the first mating surface 134-1.

In this manner, the high resistance fluid flow path 156 extends opposite to the plurality of fluid transfer bores 178 that FIG. 4B shows spaced from each other in the direction parallel to the second mating surface 134-2, that is parallel to the first mating surface 132-1 (the Y direction). The move of the third tool 244-3S is further to return the third tool along the same path to the access bore 284 at location 285 (arrow 288, FIG. 4A) and then through the access bore 284 and out of the first block. It may be understood that with this symmetry around axis 360 of third tool 244-3S, the center of cross-shaped cross-section 166 is square due to the symmetry having the axial length SL equal to the diameter d2.

With the square center 158 and the cross-shaped cross-section 166 in mind, in operation 242, another embodiment of the tool 244-3 may be used. This tool 244-3 is configured with cylindrical portion 268 of first diameter d1, second cylindrical portion 270 having a second diameter d2 greater than the first diameter d1, and third cylindrical portion 272 having a third diameter d3 the same as the first diameter d1. The second portion 270 is between the first portion 268 and the second portion 272. Symmetry around axis 360 results in a rectangular center cross-shaped cross-section 166 when the symmetry around the axis 360 is with an axial length SL either greater than, or less than, the diameter d2.

Such tool is referred to as third tool 244-3R (not shown). Third tool 244-3R is used in the same manner as described above with respect to tool 244-3S, and configures the rectangular center 158 of the cross-shaped cross-section 166.

In the various embodiments described above, the wafer diameter D extends in a direction (the Y direction) parallel to the mating surfaces 134. Also, the operations 132 and 140 of configuring the respective first and second blocks 122-1 & 122-2 configure each block from the same material taken from the group consisting of: poly vinylidine di-fluoride, and ethylene-chlorotrifluoroethylene. The operations 154 of the second series 152 also define the high resistance fluid flow path 156 extending elongated in the Y direction (parallel to the mating surfaces 122-1 &-2) for an extent at least equal to the diameter D of the wafer 102 so that within one unit 114, and within the bores 178 of that one unit 114, the substantially uniform flow rates occur completely across the wafer diameter D.

In review of the described methods of configuring the proximity head 106, the configuring is for transferring fluid relative to the head in the plurality of fluid transfer flow paths 178 of a particular unit 114. For each path 178 of that unit 114, the flow is at the rate that is substantially uniform relative to flow rates in the other paths 178 of that unit. The fluid transfer flow paths 178 may be referred to as fluid supply paths 178S in which fluid flows from the head 106 to the wafer 102. One embodiment of the method may include the operation 132 of FIG. 2 of configuring the first block 122-1 with the first mating surface 134-1 and with the solid interior bounded on one side by the first mating surface 134-1 and bounded by the respective spaced first and second end surfaces 124S1 and 124S2 extending transversely to the first mating surface 134-1 and bounded by the respective spaced front and rear surfaces 124F and 124R. A first series of the operations 142 are performed in the first block 122-1 according to the low tolerances. FIG. 1B shows the first series performed at a first location 400 between the respective front and rear surfaces 124F & 124R. Operation 144 (FIG. 2) may be a first operation to configure the path 146 as a main fluid supply flow path 146S extending through the first end surface 124S1 into the first block 122-1 and extending toward the second end surface 124S2. Operation 242 (FIG. 2) may be a second operation to configure the central section 158 (or center 310) of path 156 as a second (high resistance) fluid supply flow path 156S in the first block 122-1 through the first end surface 124S1. The central section 158 has the circular-shaped cross-section 166 comprising the resistance bore 168 as a supply resistance bore (referred to as 168S).

Operation 154 may be a third operation to configure upper plenum 160 as an upper crossing section of the second fluid supply flow path 156S, and to configure portion 162 of lower plenum 164 as a lower crossing section of the second fluid supply flow path 156S in the first block 122-1 through the first mating surface 134-1 so that the second fluid supply flow path 156S has the cross-shaped cross-section 166. Cross-shaped cross-section 166 includes plenum 160 as the first supply plenum configured as the upper crossing section and further includes lower plenum 164 as a second supply plenum configured as the lower crossing section. The supply resistance bore 168S is open to and between the first supply plenum 160 and the second supply plenum 164, the lower supply plenum 164 intersecting the first mating surface 134-1. Operation 236 (FIG. 7) may be an exemplary fourth operation to configure the paths 150 as a plurality of connector fluid supply flow paths (referred to as 150CS) in the first block 122-1 connecting the main fluid supply flow path 146S to the second fluid supply flow path (i.e., to path 156S), the configuring (FIG. 4A, via dashed line PC) of the connector fluid supply flow paths 150CS being performed by access to the first block 122-1 through plane P (FIG. 3A) of the first mating surface 134-1.

The method moves again to operation 176 in reference to FIG. 4B, also showing that paths 178 may include fluid return paths (referred to as 178R) in which fluid flows from the wafer 102 to the head 106. Operation 176 is a second series of operations in the block according to high tolerances. The second series is performed at a second location 402 between the respective front and rear surfaces 124F and 124R, and spaced (e.g., in the X direction) from the first location 400. The second series includes operation 144 as fifth operations to configure the path 146 as a main fluid return flow path (referred to as 146R) extending through the first end surface 124S1 into the first block 122-1 and extending toward the second end surface 124S1.

Operation 144 also includes a sixth operation to configure path 156 as a second fluid return flow path 156R in the first block through the first mating surface 134-1, the defined second fluid return flow path 156R having a cross-shaped cross section 166 comprising plenum 160 as an upper return plenum 160R and plenum 164 as a lower return plenum 164R and bore 168 as a return resistance bore 168R open on one side to the upper return plenum 160R and open on an opposite side to the lower return plenum 164R, the lower return plenum intersecting the first mating surface 134-1.

Operation 236 (FIG. 7) may be an exemplary seventh operation to configure paths 150 as a plurality of connector fluid return flow paths 150R in the first block connecting the main fluid return flow path 146R to the second fluid return flow path 156R, the configuring of the connector fluid return flow paths being performed by access (line PC in FIG. 4A) to the first block 122-1 through the plane P of the first mating surface 134-1.

The method moves to operation 172 (FIG. 2) for configuring the second block 122-2 with second mating surface 134-2 and with a solid interior bounded on one side by the second mating surface 134-2 and on an opposite side by the fluid transfer surface 124B and bounded by spaced second block front and rear surfaces 124F and 124R, respectively. Operation 172 may perform the third series 170 of operations in the second block 122-2 according to the high tolerances. The third series 170 is performed at a third location 404 (FIG. 1C) between the respective front and rear surfaces 124F and 124R of the second block 122-2. The third location 404 and the first location 400 are alignable (i.e., become aligned) upon mating the first and second mating surfaces, 134-1 and 134-2, respectively. The third series 170 includes operation 176 as an eighth operation to configure the portion 174 of the plenum 164 as a lower supply plenum 164S through the second mating surface 134-2 into the second block 122-2. Operation 176 may further include a ninth operation to configure the bores 178 as a plurality of fluid supply transfer bores 178S in the second block 122-2 and intersecting the low portion 174 of the lower supply plenum 164S and intersecting the lower fluid transfer surface 124B to define the fluid supply paths 128S.

A further embodiment of the operations 172 may be referred to as a fourth series of operations in the second block 122-2 according to the low tolerances. The fourth series is performed at a fourth location 406 between the respective front and rear surfaces 124F and 124R of the second block. The fourth location 406 and the second location 402 are alignable upon mating the respective first and second mating surfaces 134-1 and 134-2. The fourth series includes an operation 172 as a tenth operation to configure the portion 174R of the lower return plenum 164R through the second mating surface 134-2 into the second block 122-2. Operation 172 also includes an eleventh operation to configure bores 178 as a plurality of fluid return bores 178R in the second block 122-2 and intersecting the portion 174R of the lower return plenum 164R and intersecting the fluid transfer surface 124B to define the fluid return paths 128R.

The operation 180 is then performed for fusing the first and second mating surfaces 134-1 and 134-2, respectively, to render the first and second blocks unitary. The unitary blocks 122-1 and 122-2 are configured with the lower supply plenum 164S open to and between both the plurality of fluid supply bores 178S and the cross-shaped cross-section 166 of the second fluid supply flow path 156S. These unitary blocks are thus also configured with the lower return plenum 164R open to and between both of the plurality of fluid return bores 178R and the cross-shaped cross-section 166 of the second fluid return flow path 156R.

After the first and third series of operations, operations 182 are used for configuring resistor 184 as a supply resistor 184S for reception in the supply resistance bore 168S, the supply resistor 184S being configured according to the high tolerances. The supply resistor configuration defines path 156 as a fluid supply flow path 156S of high fluid flow resistance between the main fluid supply flow path 146S and the fluid supply bores 178S. With respect to any one unit 114, the high resistance is relative to fluid supply flow resistance of each of the main fluid supply flow path 146S and of the plurality of fluid supply bores 178S and of the connector fluid supply flow paths 150S, all of that one unit, so that fluid flowing in each of the plurality of those fluid supply bores 178S (and out of the head 106) will be at a flow rate value that is substantially uniform relative to the flow rate values of fluid flowing in all of the other fluid supply bores 178S of the one unit.

Similarly, after the second and fourth series of operations, operations 182 are used for configuring resistor 184 as a return resistor 184R for reception in the return resistance bore 168R, the return resistor 184R being configured according to the high tolerances. The return resistor configuration defines path 156 as a fluid return flow path 156R of high fluid flow resistance between the main fluid return flow path 146R and the fluid return bores 178R. The high resistance is relative to fluid return flow resistance of the main fluid return flow path 146R and of the plurality of fluid return bores 178R and of the connector fluid return flow paths 150R, so that fluid flowing in each of the plurality of fluid return bores 178R will be at a flow rate value that is substantially uniform relative to the flow rate values of fluid flowing in all of the other fluid return bores 178R, all as to the same unit 114.

It is to be understood that embodiments of some of the heads 106 may be configured with many of the units 114-1 configured as fluid supply conditioning units. Also, embodiments of some of the heads 106 may be configured with many of the units 114-2 configured as fluid return conditioning units. The method embodiments described above may be used to configure such many units 114-1 and 114-2 in one head 106. In view of the above description and Figures, it may be understood that the examples of methods relate to configuring the proximity head 106 to condition fluid flow that is relative to the proximity head 106 in processing of the surface 104 of the wafer 102 by the meniscus 108. One method example configured the proximity head 106 in one piece so that fluid may be introduced into the proximity head 106 for delivery to the wafer surface 104.

Another method example configured the head 106 so that fluid may be introduced into the proximity head 106 from the surface 104 of the wafer. In all examples, proximity head rigidity is maintained even as the head 106 is lengthened to enable cleaning of wafers 102 with large diameters D. Such rigidity results from the configuration of the head 106 using the materials that have the multiple characteristics of compatibility with the fluids, ability to be fused into the one-piece configuration shown in FIGS. 1C & 1D, for example, and the structural strength in the one-piece spanning the wafer diameters. Exemplary methods configure the proximity head to maintain the head rigidity by configuring the head as the one-piece head, while first defining the main fluid flows and defining the separate flows of fluid relative to the wafer surface, so that the flow configurations in the head enable the separate flows into the inlet ports, and from the return ports, to be substantially uniform in each unit 114 and across the increased length LH of the head 106. In one example, to provide the conditioned flows from and into the head 106, and the resulting substantially uniform flow rates in each unit 114 and across the increased length LH of the head 106, an embodiment of the method of configuring the head 106 provides many head configuration operations that are performed according to low tolerances, and requires reduced numbers of operations of head configuration according to a high tolerance.

Thus, low tolerances are used for configuring the main fluid flow path 146 and the connector fluid flow paths 150. Also, the methods of selective configuring according to high tolerances facilitate configuring the one flow resistance bore 168 and resistor 184 to provide the high resistance fluid flow path 156 between the low tolerance main fluid flow path 146 and connector paths 150. The methods further enable the configuration to provide for the respective flows of the fluid to be substantially uniform across the length of the head 016 in one unit 114 even though the many other operations are according to the low tolerances.

For more information on the operation of the proximity head 106, e.g., for the formation of the meniscus 104 and the application of the meniscus to the surface 104 of the substrate 102, reference may be made to: (1) U.S. Pat. No. 6,616,772, issued on Sep. 9, 2003 and entitled "METHODS FOR WAFER PROXIMITY CLEANING AND DRYING,"; (2) U.S. patent application Ser. No. 10/330,843, filed on Dec. 24, 2002 and entitled "MENISCUS, VACUUM, IPA VAPOR, DRYING MANIFOLD," (3) U.S. Pat. No. 6,998,327, issued on Jan. 24, 2005 and entitled "METHODS AND SYSTEMS FOR PROCESSING A SUBSTRATE USING A DYNAMIC LIQUID MENISCUS," (4) U.S. Pat. No. 6,998,326, issued on Jan. 24, 2005 and entitled "PHOBIC BARRIER MENISCUS SEPARATION AND CONTAINMENT," and (5) U.S. Pat. No. 6,488,040, issued on Dec. 3, 2002 and entitled "CAPILLARY PROXIMITY HEADS FOR SINGLE WAFER CLEANING AND DRYING," each is assigned to Lam Research Corporation, the assignee of the present application, and each is incorporated herein by reference.

For additional information regarding the functionality and constituents of Newtonian and non-Newtonian fluids, reference can be made to: (1) U.S. application Ser. No. 11/174,080, filed on Jun. 30, 2005 and entitled "METHOD FOR REMOVING MATERIAL FROM SEMICONDUCTOR WAFER AND APPARATUS FOR PERFORMING THE SAME"; (2) U.S. patent application Ser. No. 11/153,957, filed on Jun. 15, 2005, and entitled "METHOD AND APPARATUS FOR CLEANING A SUBSTRATE USING NON-NEWTONIAN FLUIDS"; and (3) U.S. patent application Ser. No. 11/154,129, filed on Jun. 15, 2005, and entitled "METHOD AND APPARATUS FOR TRANSPORTING A SUBSTRATE USING NON-NEWTONIAN FLUID," each of which is incorporated herein by reference.

The fabrication, forming and configuration operations can be directed by a computer program. The computer program in turn runs equipment that makes aspects of the proximity head. These operations can employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

While this invention has been described in terms of several embodiments, it will be appreciated that those skilled in the art upon reading the preceding specification and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps and/or operations do not imply any particular order of operation, unless explicitly stated in the claims.

The invention claimed is:

1. A method of configuring a proximity head to transfer fluid through a plurality of fluid transfer flow paths in the head and onto a surface of a semiconductor wafer, the method comprising:
   (a) providing a first block with a first mating surface;
   (b) providing a second block with a second mating surface;
   (c) performing a first series of operations in the first block, the first series of operations including:
      (i) forming a main fluid flow path;
      (ii) forming a plurality of connector fluid flow paths connected to the main fluid flow path;
      (iii) forming a high resistance fluid flow path in the first block, the high resistance fluid flow path having a cross-shaped cross-section including a plenum and a resistance bore open to the plenum;
   (d) performing a second series of operations in the second block, the second series of operations including:
      (i) forming a portion of the plenum through the second mating surface into the second block; and
      (ii) configuring a plurality of fluid transfer bores in the second block and intersecting the portion of the plenum;
   (e) fusing the first and second mating surfaces to render the first and second blocks unitary with the plenum open to and between both the plurality of fluid transfer bores and the cross-shaped cross-section of the high resistance fluid flow path, the fusing defining the proximity head used to transfer fluids to the surface of the semiconductor wafer.

2. The method of claim 1, further comprising:
forming a resistor for reception in the resistance bore, the resistor configured to be inserted in the resistance bore for making the high resistance fluid flow path between the main fluid flow path and the fluid transfer bores.

3. The method of claim 2, wherein the high resistance being relative to fluid flow resistance of the main fluid flow path and of the plurality of fluid transfer bores, and the connector fluid flow paths.

4. The method of claim 3, wherein fluid flowing in each of the plurality of fluid transfer bores will be at a flow rate value that is substantially uniform relative to the flow rate values of fluid flowing in all of the other fluid transfer bores.

5. The method of claim 1, wherein the high resistance fluid flow path in the first block includes defining the resistance bore at an intersection of the cross-shaped cross-section, and defining a cross-section of the resistance bore as an exterior of the high resistance fluid flow path.

6. The method of claim 2, further comprising:
configuring a cross-section of the resistor to define an elongated exterior resistor surface that extends along and closely-spaced from a surface of the resistance bore.

7. The method of claim 2, wherein the resistor is configured to define the high resistance fluid flow path as a tortuous flow path extending around a resistor surface in directions of the X axis and the Z axis and the X axis.

8. The method of claim 2, wherein the cross-section of the resistance bore is defined as circular.

9. The method of claim 8, wherein the resistor has a non-circular shape.

10. The method of claim 1, wherein the first and second blocks are defined from a material selected from a group consisting of one or more of a poly vinylidine di-fluoride or ethylene-chlorotrifluoroethylene.

11. The method of claim 1, wherein the operation of fusing comprises melting the material adjacent to each of the mating surfaces, and pressing the respective melted mating surfaces of the blocks toward each other to urge the respective melted material to flow together and form the blocks into one piece.

12. The method of claim 1, wherein the operation of fusing comprises:
providing a source of thermal energy, the source having a thermal transfer side corresponding to each of the respective mating surfaces;
mounting the blocks with each of the respective mating surfaces between the thermal energy transfer sides;
holding each of the respective mating surface and respective thermal transfer side parallel while moving the surface and side into close non-contacting proximity;
maintaining the close non-contacting proximity of each respective mating surface and respective thermal transfer side while transferring thermal energy to each respective mating surface to melt each respective mating surface;
rapidly removing the source from between the respective mating surfaces;
pressing the blocks toward each other to urge the melted mating surfaces into contact with each other with a fusing force; and
allowing the melted and urged mating surfaces to remain in contact in response to the constant fusing force until the urged mating surfaces have fused.

13. A method of making a proximity head to transfer fluid onto a surface of a semiconductor wafer, the method comprising:
   (a) providing a first block with a first mating surface;
   (b) providing a second block with a second mating surface;
   (c) forming a main fluid flow path in the first block and a high resistance fluid flow path in the first block, the high resistance fluid flow path having a cross-shaped cross-section including a plenum and a resistance bore open to the plenum;
   (d) forming a portion of the plenum through the second mating surface into the second block and forming a plurality of fluid transfer bores in the second block and intersecting the portion of the plenum; and
   (e) fusing the first and second mating surfaces to render the first and second blocks unitary with the plenum open to and between both the plurality of fluid transfer bores and the cross-shaped cross-section of the high resistance fluid flow path, the fusing defining the proximity head used to transfer fluids to the surface of the semiconductor wafer.

14. The method of claim 13, further comprising:
forming a resistor for reception in the resistance bore.

15. The method of claim 14, wherein the resistor is configured to be inserted in the resistance bore for making the high resistance fluid flow path between the main fluid flow path and the fluid transfer bores.

16. The method of claim 14, wherein the high resistance being relative to fluid flow resistance of the main fluid flow path and of the plurality of fluid transfer bores, and the connector fluid flow paths.

17. The method of claim 13, wherein the first and second blocks are defined from a material selected from a group consisting of one or more of a poly vinylidine di-fluoride or ethylene-chlorotrifluoroethylene.

18. The method of claim 13, wherein the operation of fusing comprises melting the material adjacent to each of the mating surfaces, and pressing the respective melted mating surfaces of the blocks toward each other to urge the respective melted material to flow together and form the blocks into one piece.

19. The method of claim 13, wherein the operation of fusing comprises:
   providing a source of thermal energy, the source having a thermal transfer side corresponding to each of the respective mating surfaces;
   mounting the blocks with each of the respective mating surfaces between the thermal energy transfer sides;
   holding each of the respective mating surface and respective thermal transfer side parallel while moving the surface and side into close non-contacting proximity;
   maintaining the close non-contacting proximity of each respective mating surface and respective thermal transfer side while transferring thermal energy to each respective mating surface to melt each respective mating surface;
   rapidly removing the source from between the respective mating surfaces;
   pressing the blocks toward each other to urge the melted mating surfaces into contact with each other with a fusing force; and
   allowing the melted and urged mating surfaces to remain in contact in response to the constant fusing force until the urged mating surfaces have fused.

20. The method of claim 13, wherein the transfer of fluid defines a meniscus between the proximity head and the surface of the substrate.

* * * * *